US012588189B2

(12) United States Patent
Sharma et al.

(10) Patent No.: US 12,588,189 B2
(45) Date of Patent: Mar. 24, 2026

(54) MEMORY DEVICES WITH VERTICAL TRANSISTORS

(71) Applicant: Intel Corporation, Santa Clara, CA (US)

(72) Inventors: Abhishek A. Sharma, Hillsboro, OR (US); Anand S. Murthy, Portland, OR (US); Wilfred Gomes, Portland, OR (US); Tahir Ghani, Portland, OR (US); Sagar Suthram, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 882 days.

(21) Appl. No.: 17/680,364

(22) Filed: Feb. 25, 2022

(65) Prior Publication Data
US 2023/0276615 A1 Aug. 31, 2023

(51) Int. Cl.
*H10B 12/00* (2023.01)

(52) U.S. Cl.
CPC ....... *H10B 12/395* (2023.02); *H10B 12/0383* (2023.02)

(58) Field of Classification Search
CPC .. H10B 12/0383; H10B 12/05; H10B 12/395; H10B 12/482; H10D 30/6928; H10D 30/6735
USPC .................................................. 257/135, 302
See application file for complete search history.

(56) References Cited

U.S. PATENT DOCUMENTS

| | | | |
|---|---|---|---|
| 9,647,112 B1 * | 5/2017 | Balakrishnan | ....... H10D 62/151 |
| 2009/0101969 A1 * | 4/2009 | Katsumata | ............. H10D 30/63 257/329 |
| 2023/0062524 A1 * | 3/2023 | Liu | ........................ H10B 63/10 |

* cited by examiner

*Primary Examiner* — Hoai V Pham
(74) *Attorney, Agent, or Firm* — Akona IP PC

(57) ABSTRACT
Memory devices including vertical transistors and methods of forming such memory devices are disclosed. An example memory device includes a substrate, a BL in the substrate, a channel region over a portion of the BL, a second region over the channel region, an insulator wrapped around at least a portion of the channel region, and a WL. The BL also operates as one of a source region and a drain region of the transistor. The second region is the other one of the source region and the drain region. The WL wraps around at least a portion of the insulator and is separated from the channel region by the insulator. In some embodiments, the BL is formed in a trench in the substrate. An aspect ratio of the BL is in a range from 0.5 to 10. The BL may have a higher conductivity than the channel region.

10 Claims, 19 Drawing Sheets

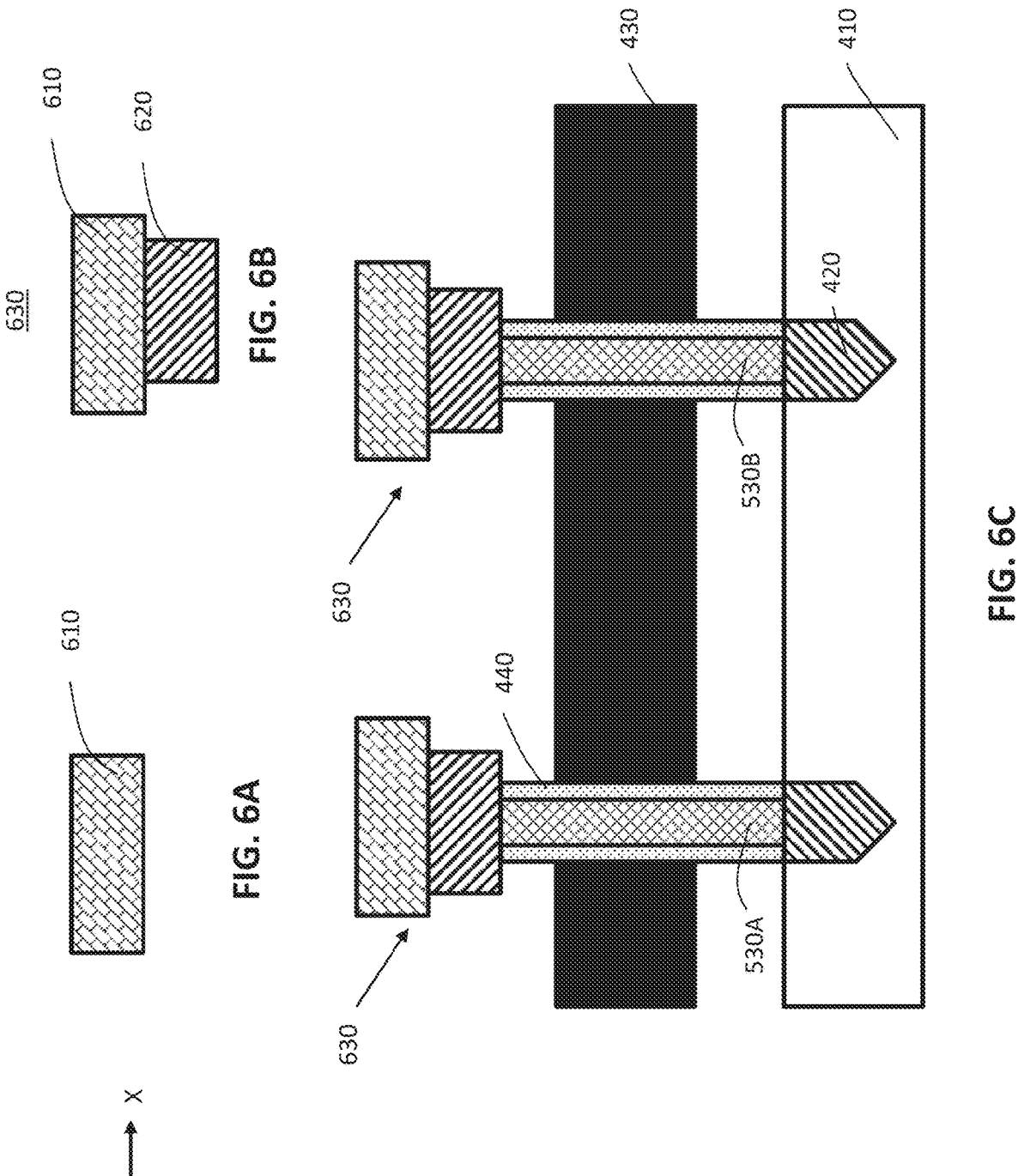

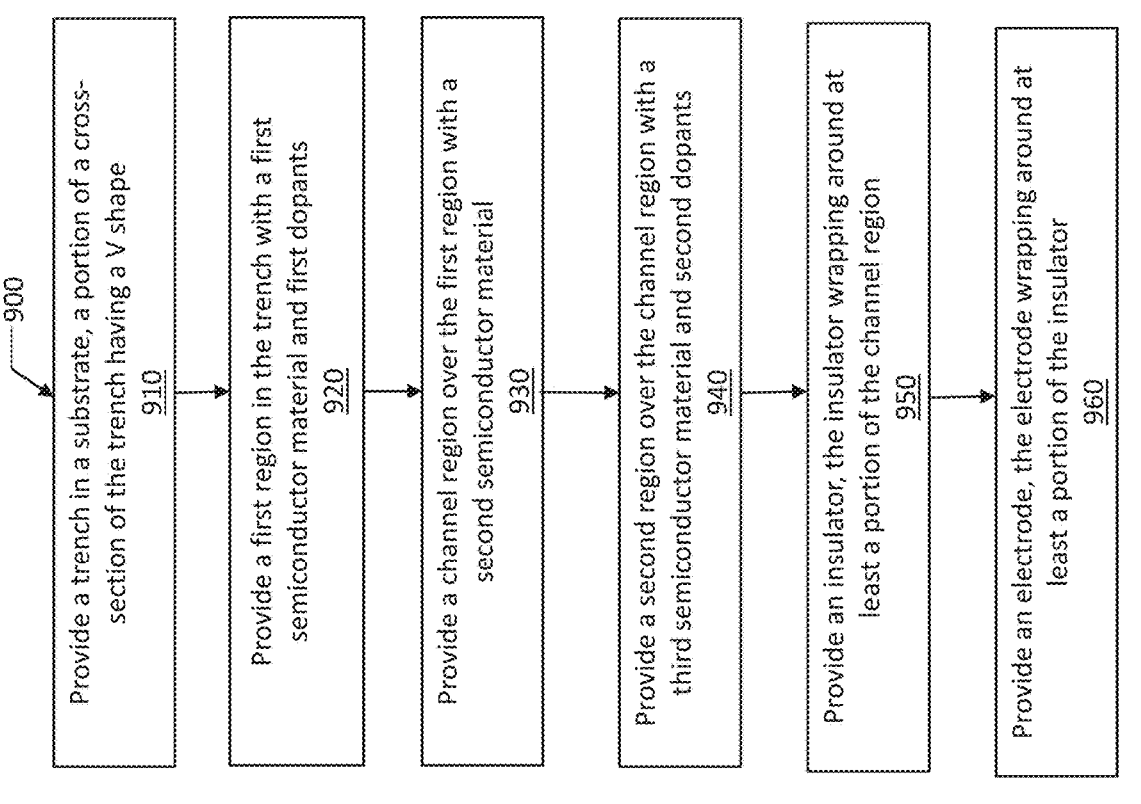

900

Provide a trench in a substrate, a portion of a cross-section of the trench having a V shape
910

Provide a first region in the trench with a first semiconductor material and first dopants
920

Provide a channel region over the first region with a second semiconductor material
930

Provide a second region over the channel region with a third semiconductor material and second dopants
940

Provide an insulator, the insulator wrapping around at least a portion of the channel region
950

Provide an electrode, the electrode wrapping around at least a portion of the insulator
960

FIG. 9

MEMORY DEVICES WITH VERTICAL TRANSISTORS

TECHNICAL FIELD

This disclosure relates generally to the field of semiconductor devices, and more specifically, to integrated circuit (IC) devices.

BACKGROUND

Embedded memory is important for future generation microprocessors and system-on-a-chip (SoC) technology. Low-power and high-density embedded memory is used in many different computer products and further improvements are always desirable. Memory devices with vertical transistors may pave the way for a promising technology that can enable viable embedded memory solutions.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 6A-6D illustrate a process of forming semiconductor structures over the channel regions in FIGS. 5A and 5B, according to some embodiments of the disclosure.

FIG. 9 is a flowchart showing a method of forming an IC device, in accordance with various embodiments.

DETAILED DESCRIPTION

Overview

Figure 1:
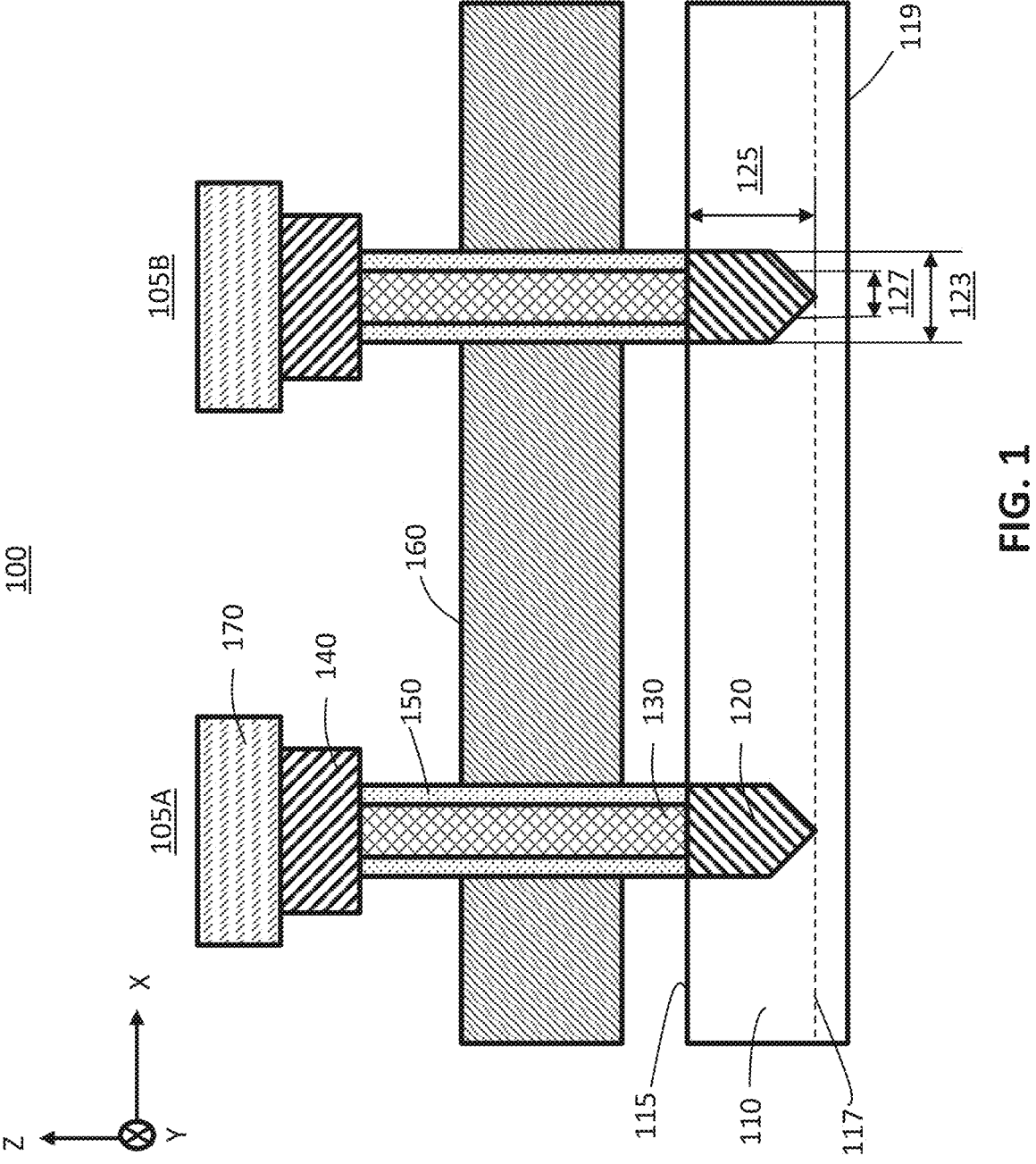
FIG. 1 is a cross-sectional view of an example memory device including vertical transistors, according to some embodiments of the disclosure.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

Embodiments of the present disclosure are applicable to different types of memory devices. A memory device may include a memory array. A memory array may be an array of memory cells that are arranged in columns and rows. A memory cell may include a memory element and an access transistor. The memory element may be, for example, a ferroelectric memory element, a magnetic storage element, a resistor, or another transistor. The access transistor controls access to the cell (e.g., access to write information to the cell or access to read information from the cell). Such a memory cell may be referred to as a "1T-1X memory cell," highlighting the fact that it uses one transistor (i.e., "1T" in the term "1T-1X memory cell") and one memory element (i.e., "1X" in the term "1T-1X memory cell"). For example, a DRAM memory cell may include a capacitor for storing a bit value or a memory state (e.g., logical "1" or "0") of the cell, and an access transistor controlling access to the cell. Such a memory cell may be referred to as a "1T-1C memory cell," highlighting the fact that it uses one transistor and one capacitor (i.e., "1C" in the term "1T-1C memory cell"). The memory element of a 1T-1X memory cell may be coupled to one source/drain (S/D) region/terminal of the access transistor (e.g., to the source region of the access transistor), while the other S/D region of the access transistor may be coupled to a BL, and a gate terminal of the transistor may be coupled to a wordline (WL). Since such a memory cell can be fabricated with as little as a single access transistor, it can provide higher density and lower standby power versus some other types of memory in the same process technology, e.g., SRAM. Various 1T-1X memory cells have, conventionally, been implemented with access transistors being FEOL (front-end-of-line), logic-process based, transistors implemented in an upper-most layer of a semiconductor substrate.

One challenge common to 1T-1X memory cells resides in that, given a usable surface area of a substrate, there are only so many FEOL transistors that can be formed in that area, placing a significant limitation on the density of memory cells incorporating such transistors. In conventional solutions, attempts to increase memory density have included decreasing the critical dimensions of the memory cells, which requires ever-increasing process complexity and cost, resulting in diminishing returns and expected slow pace of memory scaling for future nodes.

Embodiments of the present disclosure may improve on at least some of the challenges and issues described above by accessing transistors fabricated with aspect ratio trapping. As described herein, a memory device may include a substrate, a BL in the substrate, a channel region over the substrate, a second region over the channel region, an insulator wrapped around at least a portion of the channel region, and a WL. A portion of the BL also operates as a S/D region of the transistor. The second region is the other S/D region of the transistor. The WL wraps around at least a portion of the insulator and is separated from the channel region by the insulator.

The BL may have an aspect ratio in a range from 0.5 to 10. The aspect ratio is a ratio of a height of the BL to a width of the BL. The height and width are measured in a transvers cross-section of the BL. The transvers cross-section is perpendicular to a longitudinal axis of the BL. A length of the BL along the longitudinal axis may be greater than the height and width of the BL. In some embodiments, the BL is formed in a trench in the substrate. The BL may be highly doped, e.g., with a dopant concentration of at least $1\cdot10^{21}$ $cm^{-3}$. The BL may also be formed with defects (e.g., cracks, etc.) intentionally, unintentionally, or a combination of both. The dopants and defects in the BL can make it electrically conductive so that it can be used as a control line of the memory device. With the aspect ratio of the BL, the defects in the BL are trapped in the substrate, i.e., the expansion of the defect into the channel region is prevented or limited. That way, the conductivity of the channel region would not be impacted by the defects in the BL. Also, the channel region has a lower dopant concentration than the BL. The channel region may be undoped or slightly doped. The channel region is less conductive than the BL.

In some embodiments, different portions of the BL may be used as S/D regions of different transistors, and the WL may be used as the gate electrodes of those transistors. That way, more transistors can be arranged in the memory device to form more memory cells. The memory cells may have an 1T-1X implementation, where each of the S/D regions other than the portions of the BL may be coupled to a single memory element.

Compared with other types of memory devices, the memory device of the present disclosure is more advantageous with respect to memory cell density. By using WL as gate electrodes of transistors and using BL as S/D regions of the transistors, the memory cell is more compact and can take less space. That way, more memory cells can be arranged in the same memory area. Also, the present disclosure provides a 1T-1X implementation, and the memory cell area can be as small as $4F^2$ or $6F^2$. Thus, the memory device 100 can provide a high memory cell density. Furthermore, the transistors can be either MOSFETs, TFETs, or both. Thus, the memory device may operate in both low-power and high-power applications.

In the following, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art. Also, the term "or" refers to an inclusive "or" and not to an exclusive "or."

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 11A-11B, such a collection may be referred to herein without the letters, e.g., as "FIG. 11."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with stacked memory devices as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Memory Device with Vertical Transistors

FIG. 1 is a cross-sectional view of an example memory device 100 including vertical transistors 105A and 105B (collectively referred to as "vertical transistors 105" or "vertical transistor 105"), according to some embodiments of the disclosure. The memory device 100 also includes a substrate 110 and a WL 160. In other embodiments, the memory device 100 may include more, fewer, or different components. For instance, the memory device 100 may include multiple WLs, a different number of vertical transistors, etc. The memory device 100 may be an IC device, or a part of an IC device. FIG. 1 also shows a coordinate system where the memory device 100 is placed. The coordinate system includes an X-axis, a Y-axis, and a Z-axis that are orthogonal to each other.

The substrate 110 may be any suitable structure with which the vertical transistors 105 can be associated. In the embodiment of FIG. 1, the vertical transistors 105 are partially in the substrate 110. In other embodiments, a vertical transistor 105 may be associated with the substrate 110 in different ways. For instance, a vertical transistor 105 may be placed over the substrate 110, e.g., on a surface of the substrate 110.

The substrate 110 may be a support structure, a die, a wafer, or a chip. In some embodiments, the substrate 110 may be a printed circuit board (PCB) substrate. In other embodiments, the substrate 110 is a semiconductor substrate, which is composed of semiconductor material systems including, for example, n-type or p-type materials systems. One or more transistors may be built on the substrate 110. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of Group III-V, Group II-VI, or Group IV materials. In some embodiments, the substrate may be non-crystalline.

Although a few examples of materials from which the substrate 110 may be formed are described here, any material that may serve as a foundation upon which IC devices implementing fill patterns as described herein may be built falls within the spirit and scope of the present disclosure. In various embodiments, the substrate 110 may include any such substrate material that provides a suitable surface for forming the fill pattern. The substrate 110 may, e.g., be the wafer 2000 of FIG. 11A, discussed below, and may be, or be included in, a die, e.g., the singulated die 2002 of FIG. 11B, discussed below.

A vertical transistor 105 includes a first region 120, a channel region 130, a second region 140, and an insulator 150. The first region 120, channel region 130, and second region 140 are stacked vertically with respect to the substrate 110. The first region 120 is in the substrate 110. The channel region 130 is between the first region 120 and the second region 140. In the embodiment of FIG. 1, the channel region 130 is over the substrate 110, particularly on a surface 115 of the substrate 110. The first region 120 extends between the surface 115 and another surface 119 of the substrate 110. The surface 119 is opposite the surface 115. In the embodiment of FIG. 1, the first region extends from the surface 115 to a cross-section 117 of the substrate 110. The cross-section 117 may be parallel to the surface 115.

The channel region 130 includes a channel material. The channel material may be composed of semiconductor material systems including, for example, n-type or p-type materials systems. In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a compound semiconductor with a first sub-lattice of at least one element from Group III of the periodic table (e.g., Al, Ga, In), and a second sub-lattice of at least one element of group V of the periodic table (e.g., P, As, Sb). In some embodiments, the channel material may include a compound semiconductor with a first sub-lattice of at least one element from Group II of the periodic table (e.g., Zn, Cd, Hg), and a second sub-lattice of at least one element of Group IV of the periodic table (e.g., C, Si, Ge, Sn, Pb). In some embodiments, the channel material is an epitaxial semiconductor material deposited using an epitaxial deposition process. The epitaxial semiconductor material may have a polycrystalline structure with a grain size between about 2 nanometers and 100 nanometers, including all values and ranges therein.

For some example n-type transistor embodiments (i.e., for the embodiments where the MOSFET is a NMOS transistor and the TFET is a n-type TFET), the channel material may advantageously include a III-V material having a high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material may be an intrinsic III-V material, i.e., a III-V semiconductor material not intentionally doped with any electrically active impurity. In alternate embodiments, a nominal impurity dopant level may be present within the channel material, for example to further fine-tune a threshold voltage Vt, or to provide HALO pocket implants, etc. Even for impurity-doped embodiments however, impurity dopant level within the channel material 304 may be relatively low, for example below $10^{15}$ dopant atoms per cubic centimeter ($cm^{-3}$), and advantageously below $10^{13}$ $cm^{-3}$. These materials may be amorphous or polycrystalline, e.g., having a crystal grain size between 0.5 nanometers and 100 nanometers.

For some example p-type transistor embodiments (i.e., for the embodiments where the MOSFET is a PMOS transistor and the TFET is a p-type TFET), the channel material may advantageously be a Group IV material having a high hole mobility, such as, but not limited to Ge or a Ge-rich SiGe alloy. For some example embodiments, the channel material may have a Ge content between 0.6 and 0.9, and advantageously may be at least 0.7. In some embodiments with highest mobility, the channel material may be intrinsic III-V (or IV for P-type devices) material and not intentionally doped with any electrically active impurity. In alternate embodiments, one or more a nominal impurity dopant level may be present within the channel material, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. These materials may be amorphous or polycrystalline, e.g., having a crystal grain size between 0.5 nanometers and 100 nanometers.

In some embodiments, the channel material may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, aluminum zinc oxide, or tungsten oxide. In general, for a thin film transistor, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, molybdenum disulfide, N- or P-type amorphous or polycrystalline silicon, monocrystalline silicon, germanium, indium arsenide, indium gallium arsenide, indium selenide, indium antimonide, zinc antimonide, antimony selenide, silicon germanium, gallium nitride, aluminum gallium nitride, indium phosphite, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc. In some embodiments, a thin film channel material may be deposited at relatively low temperatures, which allows depositing the channel material within the thermal budgets imposed on back-end fabrication to avoid damaging other components, e.g., front end components such as logic devices.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

The channel region 130 may be an (or a part of an) elongated semiconductor structure that has a longitudinal axis and a transverse cross-section in a plane perpendicular to the longitudinal. For instance, the longitudinal axis is along the Z-axis. A dimension of the elongated semiconductor structure along the Z-axis is greater than the dimensions of the elongated semiconductor structure along the X- and Y-axes. The transverse cross-section is in the X-Y plane. The transverse cross-section may have various shapes, such as circular, rectangular, square, triangle, trapezoid, oval, parallelogram, and so on. The elongated semiconductor structure may be a fin, a nanoribbon (the transverse cross-section of which is rectangular), nanowire (the transverse cross-section of which is circular), etc.

The first region 120 and the second region 140 are connected to the channel region 130. One of the first region 120 and the second region 140 is the source of the vertical transistor 105 and the other one is the drain of the vertical transistor 105. The first region 120 and the second region 140 each includes a semiconductor material with dopants. A semiconductor material of the first region 120 or second region 140 may be a Group IV material, a compound of Group IV materials, a Group III/V material, a compound of Group III/V materials, a Group II/VI material, a compound of Group II/VI materials, or other semiconductor materials. Example Group II materials include zinc (Zn), cadmium (Cd), and so on. Example Group III materials include aluminum (Al), boron (B), indium (In), gallium (Ga), and so on. Example Group IV materials include silicon (Si), germanium (Ge), carbon (C), etc. Example Group V materials include nitrogen (N), phosphorus (P), arsenic (As), antimony (Sb), and so on. Example Group VI materials include sulfur (S), selenium (Se), tellurium (Te), oxygen (O), and so on. A compound of Group IV materials can be a binary compound, such as SiC, SiGe, and so on. A compound of Group III/V materials can be a binary, tertiary, or quaternary compound, such as GaN, InN, and so on. A compound of Group II/VI materials can be a binary, tertiary, or quaternary compounds, such as CdSe, CdS, CdTe, ZnO, ZnSe, ZnS, ZnTe, CdZnTe, CZT, HgCdTe, HgZnTe, and so on.

A vertical transistor 105 may be a MOSFET or TFET. In some embodiments, the memory device 100 may include both MOSFET(s) and TFET(s). In some embodiments (e.g., embodiments where a vertical transistor 105 is a MOSFET), the first region 120 and the second region 140 are doped with dopants of the same type, e.g., n-type or p-type. In an example where the vertical transistor 105 is a PMOS transistor, the first region 120 and the second region 140 are doped with p-type dopants. In an example where the vertical transistor 105 is a NMOS transistor, the first region 120 and the second region 140 are doped with n-type dopants. In other embodiments (e.g., embodiments where a vertical transistor is a TFET), the first region 120 and the second region 140 are doped with dopants of opposite types. In an example, the first region 120 is doped with n-type dopants and the second region 140 is doped with p-type dopants. In another example, the first region 120 is doped with p-type dopants and the second region 140 is doped with n-type dopants. Example n-type dopants include Te, S, As, tin (Sn), Si, Ga, Se, S, In, Al, Cd, chlorine (Cl), iodine (I), fluorine (F), and so on. Example p-type dopants include beryllium (Be), Zn, magnesium (Mg), Sn, P, Te, lithium (Li), sodium (Na), Ga, Cd, and so on.

In some embodiments, the S/D regions may be highly doped (e.g., with dopant concentrations of about $1 \cdot 10^{21}$ cm$^{-3}$ or higher) and may form Ohmic contacts with the respective S/D contacts (also sometimes interchangeably referred to as "S/D electrodes"), although these regions may also have lower dopant concentrations and may form Schottky contacts in some implementations. Irrespective of the exact doping levels, the S/D regions may be the regions having dopant concentration higher than in other regions, e.g., higher than a dopant concentration in the channel region 130. The channel region 130 may include one or more semiconductor materials with doping concentrations significantly smaller than those of the S/D regions. For example, in some embodiments, the channel material of the channel region 130 may be an intrinsic (e.g., undoped) semiconductor material or alloy, not intentionally doped with any electrically active impurity. In alternate embodiments, nominal impurity dopant levels may be present within the channel material, for example to set a threshold voltage Vt, or to provide HALO pocket implants, etc. In such impurity-doped embodiments however, impurity dopant level within the channel material is still significantly lower than the dopant level in the source region 150 and the drain region 160, for example below $10^{15}$ cm$^{-3}$, or below $10^{13}$ cm$^{-3}$.

The source region of the vertical transistor 105 can form a source-channel interface with the channel region 130. In some embodiments, a portion of the source-channel interface is in the source region and another portion of the source-channel interface is in the channel region 130. The source-channel interface may include the dopants in the source region and can be formed through mitigation of the dopants in a direction from the source region to the channel region 130. There can be a gradual change in the concentration of the dopants in the source-channel interface. For instance, the concentration of the dopants in the source-channel interface decreases along the direction from the source region to the channel region 130, i.e., there is less dopants per unit volume as it is father from the source region and closer to the channel region 130. Similarly, the drain region of the vertical transistor 105 can form a drain-channel interface with the channel region 130. The drain-channel interface may include the dopants in the drain region and can be formed through mitigation of the dopants in a direction from the drain region to the channel region 130. There can be a gradual change in the concentration of the dopants in the drain-channel interface. For instance, the concentration of the dopants in the drain-channel interface decreases along the direction from the drain region to the channel region 130, i.e., there is less dopants per unit volume as it is father from the drain region and closer to the channel region 130. In some embodiments, a dimension of the drain-channel interface or drain-channel interface along the Z-axis is no more than 2 nm.

The insulator 150 wraps around the channel region 130 and separates the channel region 130 from the WL 160. The insulator 150 includes an electrical insulator, such as a dielectric material, hysteretic material, and so on. Example dielectric material includes oxide (e.g., Si based oxides, metal oxides, etc), high-k dielectric, and so on. Example hysteretic material include ferroelectric materials, antiferroelectric materials, etc. In the embodiment of FIG. 1, the insulator 150 is placed on the surface 115 of the substrate 110. Also, the insulator 150 wraps around the whole channel region 130. In other embodiments, the insulator 150 may not touch the substrate 110. The insulator 150 may wrap around a portion of the channel region 130 or at least a portion of the second region 140.

The WL 160 is electrically conductive. The WL 160 may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals. In the embodiment of FIG. 1, the WL 160 also function as the gate electrodes of the vertical transistors 105. The WL 160 can be coupled to a gate terminal to apply a gate voltage on the vertical transistors 105. The WL 160 has a longitudinal axis along the X-axis. The WL 160 is coupled to the first region 120. The first region 120 has a longitudinal axis that is orthogonal to the longitudinal axis of the WL 160. For instance, the longitudinal axis of the first region 120 is along the Y-axis.

In the embodiment of FIG. 1, the first region 120 is electrically conductive and is a portion of a BL of the memory device 100. The first region 120 may be more conductive than the channel region 130. For instance, a conductive of the first region 120 may be at least 10 times higher than a conductivity of the channel region. In some embodiments, the first region 120 can be more conductive than the second region 140. The first region 120 may be highly doped. For instance, the concentration of dopants in the first region 120 may be at least $1 \cdot 10^{21}$ cm$^{-3}$.

The first region 120 may include defects, such as cracks, which can contribute to the conductivity of the first region 120. An aspect ratio of a cross-section of the first region in a X-Z plane (i.e., a ratio of a length 125 along the Z-axis to a width 123 along the X-axis) can be in a range from 0.5 to 10. The width 123 equals the width of the first region 120 on the surface 115 of the substrate 110. The width of the first region 120 (particularly at the tip) along the X-axis decreases as it gets further from the surface 115 and closer to the surface 119. Also, the area of cross-sections of the first region (e.g., cross-sections in parallel with the surface 115) decreases as it gets closer to the cross-section 117 117 of the substrate 110. For instance, a width 127 is shorter than the width 123. As shown in FIG. 1, the width 123 is closer to the surface 115 than the width 127.

In the embodiment of FIG. 1, the cross-section of the first region 120 has a V-shaped tip. In other embodiments, the top of the first region 120 may have a different shape. Such as shape of the first region 120, particularly the shape having the aspect ratio, can prevent cracks in the first region 120 from spreading into the channel region 130. In some embodiments, the number of defects (e.g., cracks) per unit volume of the first region 120 is higher than number of defects (e.g., cracks) per unit volume of the channel region 130. In some embodiments, the number of defects (e.g., cracks) per unit volume of the first region 120 may be at least two times higher than number of defects (e.g., cracks) per unit volume of the channel region 130.

The second region 140 is coupled to a memory element 170. The memory element may be a capacitor. Thus, the memory device 100 has a 1T-1C (one access transistor (1T) and one capacitor (1C) (1T-1C)) implementation. In some embodiments, the memory device 100 has a memory cell area equal to 4F$^2$, where F is one half the sum of the WL width and the separation distance between WLs. More details regarding 1T-1C memory cell are described below in conjunction with FIG. 10.

Compared with other types of memory devices, the memory device 100 provide multiple advantages with respect to increasing memory cell density. First, the WL 160 is also used as gate electrodes of the vertical transistors 105. Second, the BLs are also used as source or drain regions of the vertical transistors 105. Third, the memory device 100 has the 1T1C implementation and the memory cell area can be as small as 4F$^2$. Thus, the memory device 100 can provide a higher memory cell density. Additionally, the vertical transistors 105 can be either MOSFETs, TFETs, or both. Thus, the memory device 100 may operate in both low-power and high-power applications.

Figure 2:
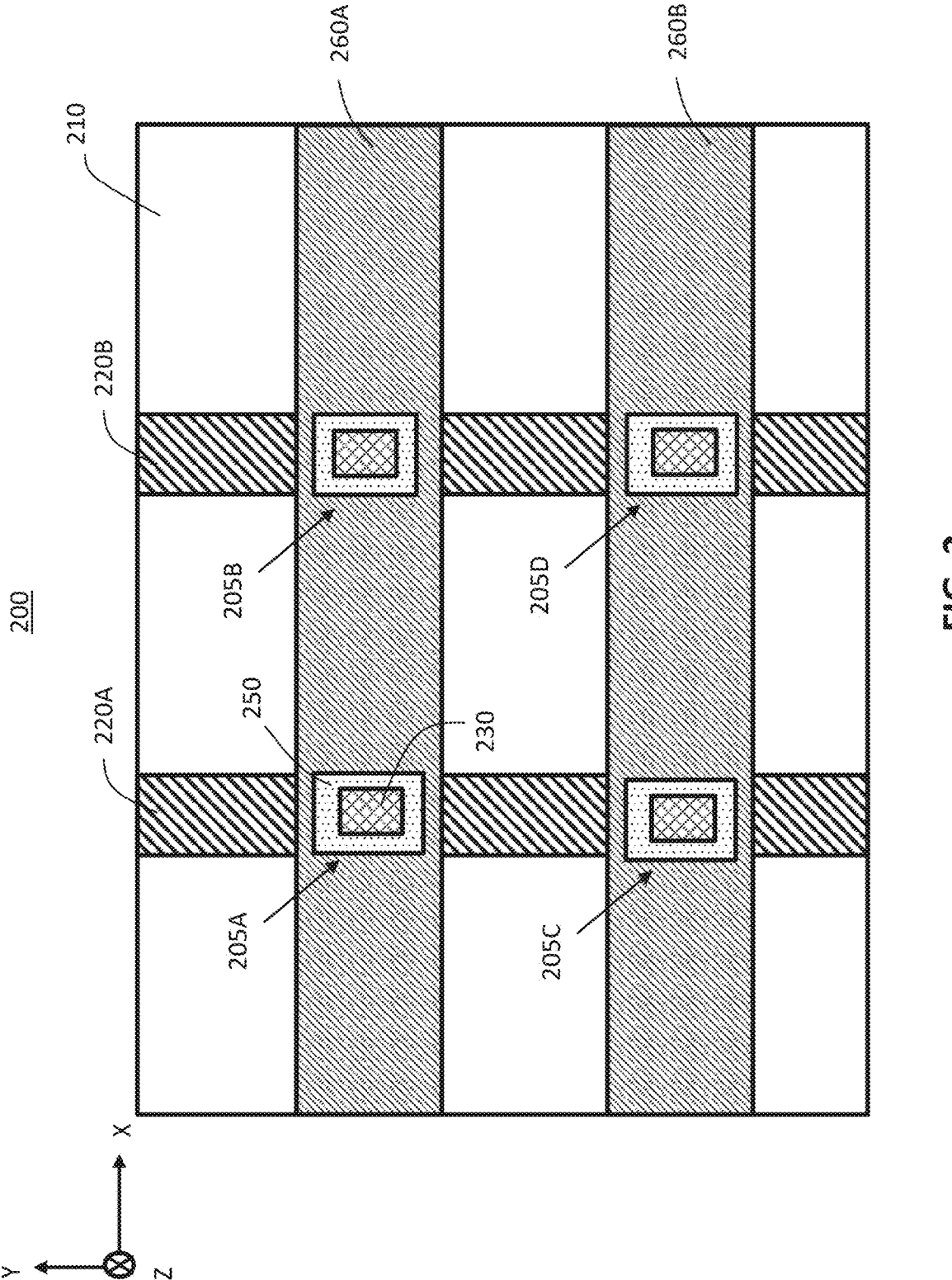
FIG. 2 is a cross-sectional view of another example memory device including vertical transistors, according to some embodiments of the disclosure.

FIG. 2 is a cross-sectional view of another example memory device 200 including vertical transistors 205A-D, according to some embodiments of the disclosure. In the embodiment of FIG. 2, the memory device includes four vertical transistors 205A-D (collectively referred to as "vertical transistors 205" or "vertical transistor 205"). The memory device 200 also includes a substrate 210, BLs 220A and 220B (collectively referred to as "BLs 220" or "BL 220"), and WLs 260A and 260B (collectively referred to as "WLs 260" or "WL 260"). In other embodiments, the memory device 200 may include a different number of BLs or WLs.

A vertical transistor 205 may be a FET, such as MOSFET or TFET. A vertical transistor 205 may be an embodiment of the vertical transistor 105 in FIG. 1. As shown in FIG. 2, a vertical transistor 205 includes a channel region 250 and an insulator 230. The channel region 250 may be an elongated semiconductor structure, such as a nanowire, nanoribbon, fin, etc. The insulator 230 insulates the channel region 250 from the WL 260. The channel region 250 is wrapped around by the insulator 230. The insulator 230 is wrapped around by the WL 260 coupled with the vertical transistor 205. The WL 260 may be coupled to a gate terminal of the vertical transistor 205 and a gate voltage can be applied to the vertical transistor 205 through the WL 260. The WL 260 functions as the gate electrode of the vertical transistor 205. The vertical transistor 205 also includes a source region and a drain region, which are not shown in FIG. 2. The source region and drain region may be placed at opposite sides of the channel region 250. An embodiment of the source region is the first region 120 or second region 140 in FIG. 1. An embodiment of the drain region is the first region 120 or second region 140 in FIG. 1.

Even though not shown in FIG. 2, each vertical transistor 205 may be coupled to a transistor to constitute a 1T-1C memory cell. The four vertical transistors 205 can be used to form four 1T-1C memory cells. The memory cells may be DRAM memory cells, SRMA memory cells, or other types of memory cells. The memory cells are arranged in rows and columns, where a row of memory cells are coupled to a common WL, and a column of memory cells are coupled to a common BL. For instance, the two memory cells including the vertical transistors 205A and 205B are both coupled to the WL 260A, and the two memory cells including the vertical transistors 205C and 205D are both coupled to the WL 260B. Also, the two memory cells including the vertical transistors 205A and 205C are both coupled to the BL 220A, and the two memory cells including the vertical transistors 205B and 205D are both coupled to the BL 220B. In other embodiments, a column of memory cells may be coupled to two BLs, such as a first BL and a second BL that is the inverse of the first BL.

The substrate 210 is associated with the vertical transistors 105. In some embodiments, a portion of a vertical transistor 105 may be inside the substrate 210 and the rest of the vertical transistor 105 can be placed over the substrate 210. The substrate 210 may be the same or similar to the substrate 110.

Example Processes of Forming Vertical Transistors with Aspect Ratio Trapping

Figures 3A, 3B:
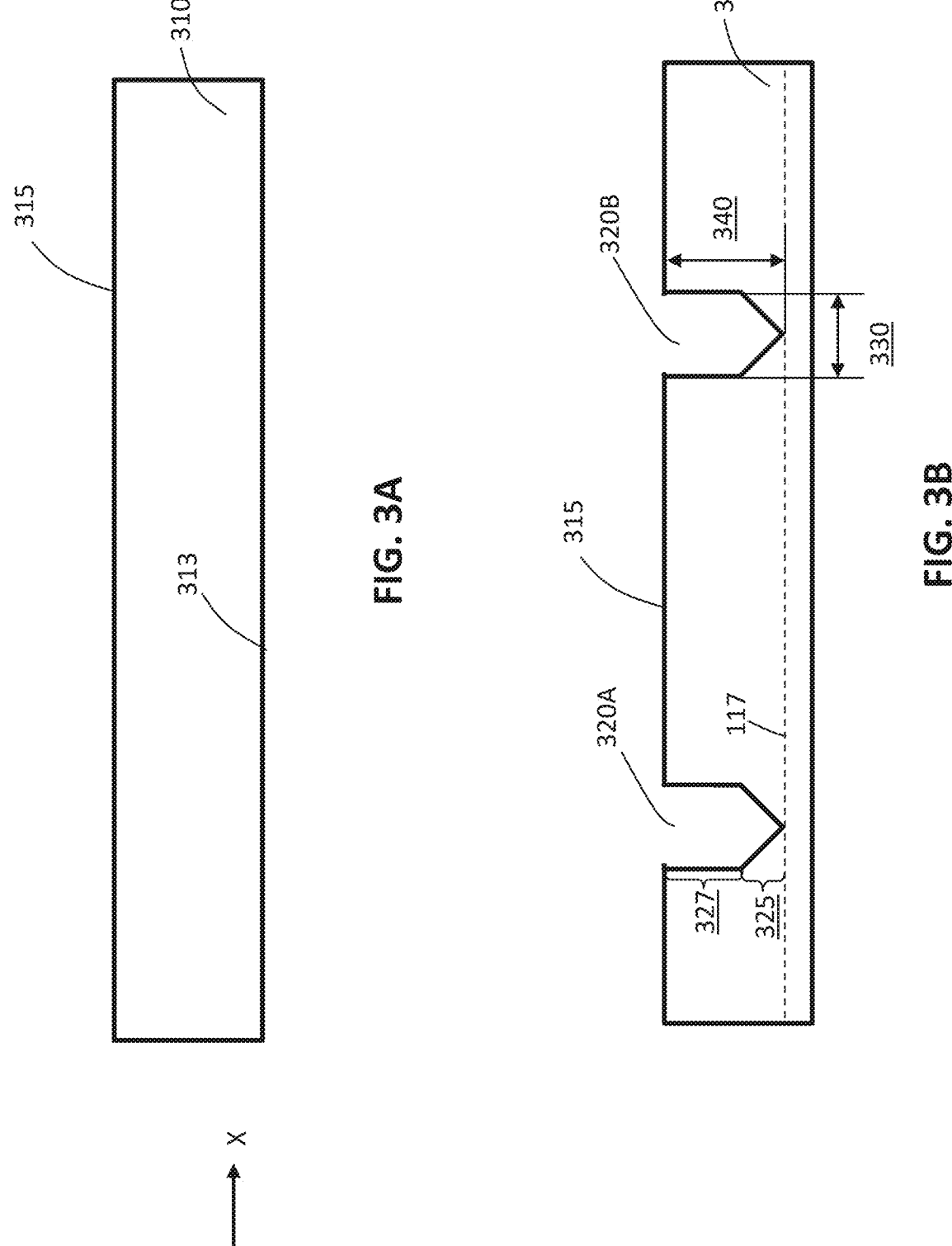
FIGS. 3A-3D illustrate formation of bitlines (BLs) in a substrate, according to some embodiments of the disclosure.
Figures 3C, 3D:
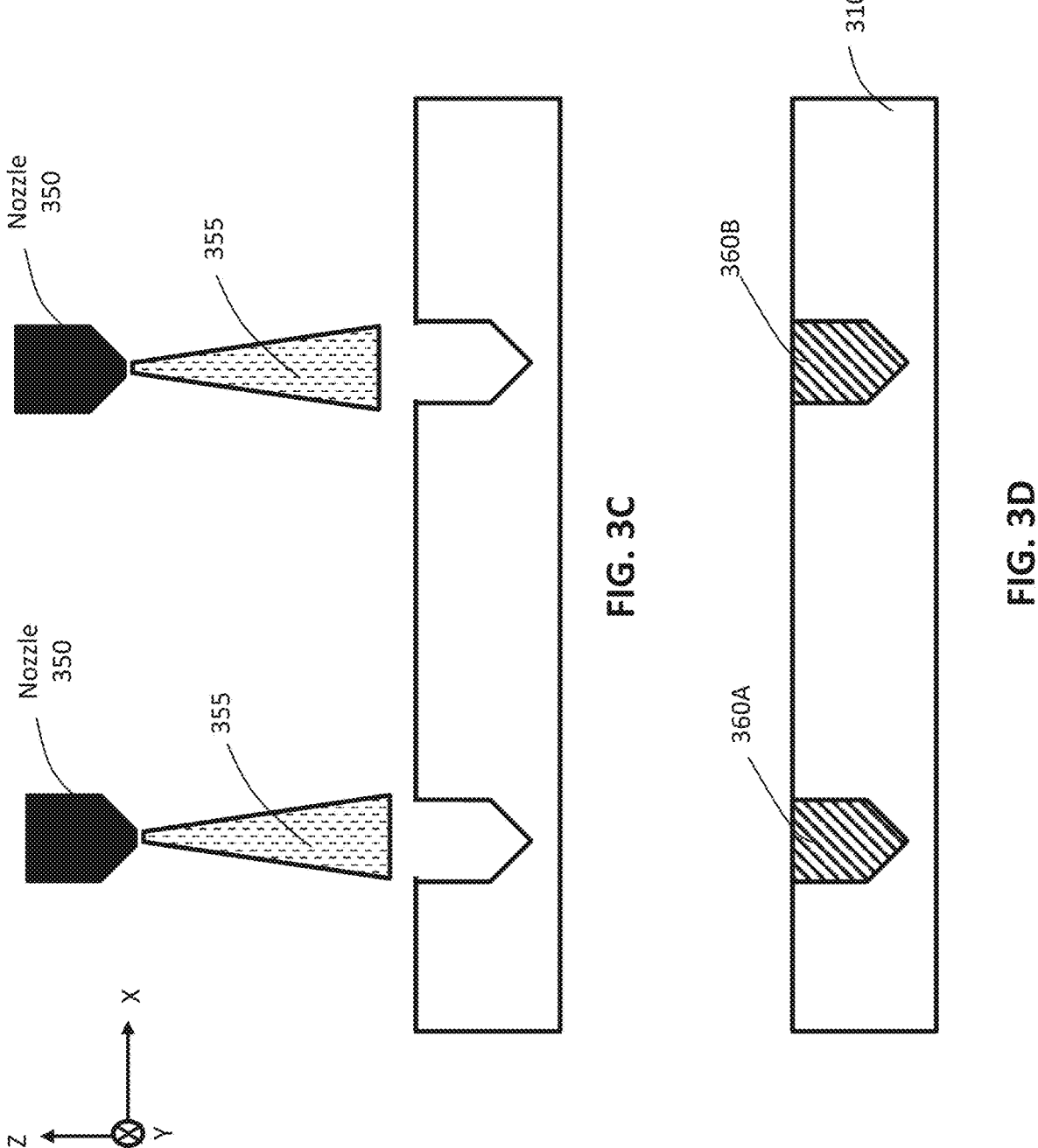

FIGS. 3A-3C illustrate formation of BLs in a substrate 310, according to some embodiments of the disclosure. FIG. 3A shows a cross-section of the substrate 310 in a X-Z plane. The substrate 310 has surfaces 313 and 315. The surface 313 is opposite the surface 315. The cross-section of the substrate 310 has a rectangular shape. In other embodiments, the cross-section may have a different shape. The substrate 310 may be the same or similar to the substrate 110.

In FIG. 3B, trenches 320A and 320B (collectively referred to as "trenches 320" or "trench 320") are formed in the substrate 310. A trench 320 in opening in the substrate 310. The trench 320 may be an elongated opening that has a longitudinal axis along the Y-axis and a transvers cross-section in the X-Z plane, which is orthogonal to the longitudinal axis. The dimension of the trench 320 along the Y-axis may be greater than the dimensions of the trench 320 along the X-axis and Z-axis. As shown in FIG. 3B, the transvers cross-section of the trench 320 is between the surface 315 and a cross-section 317 of the substrate 310 in a X-Y plane. The trench 320 extends from the surface 315 to the cross-section 317 along the Z-axis, with a tip of the trench 320 located at the cross-section 317. The trench 320 includes a first section 325 and a second section 327. The trench 320 has a width 330 along the X-axis, which is also the width of the second section 327 along the X-axis. The trench 320 has a height 340 along the Z-axis, which includes both the height of the first section 325 and the second section 327. A ratio of the height 340 to the width 330 is an aspect ratio of the trench 320. The aspect ratio may be in a range from 0.5 to 20. As shown in FIG. 3B, the cross-section of the first section 325 in the X-Z plane has a V shape, and the cross-section of the second section 327 in the X-Z plane has a rectangular shape. In other embodiments, the first section 325, the second section 327, or the whole trench 320 may have different shapes from the shapes shown in FIG. 3B. For instance, the tip of the trench 320 at the cross-section 317 of the substrate 310 may be a rounded tip, instead of a sharp tip. The width of the trench 320, or of a portion of the trench 320 (e.g., the first section 325) may decrease along the Z-axis in a direction from the surface 315 to the cross-section 317 of the substrate 310. In other words, the trench 320 becomes narrows as it gets deeper in the substrate 310.

In FIG. 3C, a spraying assembly 350 sprays a fluid 355 into each trench 320. In FIG. 3D, BLs 360A and 360B (collectively referred to as "BLs 360" or "BL 360") are formed in the two trenches 320, respectively. A BL 360 may fill up the whole trench 320 or most of the trench 320. The BL 360 may have the dimensions and shape of the trench 320, which are described above.

The fluid 355 may be a gas, liquid, or supercritical fluid. The fluid 355 includes one or more precursors of a semiconductor material. A precursor may include the semiconductor material or one or more chemical elements of the semiconductor material. The semiconductor material may be formed through a chemical reaction between multiple precursors, chemical reaction between a precursor and a material in the substrate 310, chemical reaction between a precursor and a material in the environment (e.g., a deposition chamber), or some combination thereof. The fluid 355 may also include other materials, such as n-type or p-type dopants.

In some embodiments, the spraying of the fluid 355 is performed in a chamber. The chamber may provide a controlled environment with a predetermined temperature or pressure. For example, the chamber provides a vacuum environment (e.g., a pressure of $10^{-8}$-$10^{-12}$ Torr) to prevent contamination. As another example, the chamber has a temperature and pressures to maintain the phase of the precursor, which may be gas, liquid, or superfluid. In some embodiments, the chamber may include plasma that facilitates the spraying of the fluid 355. For example, before the fluid 355 is sprayed into the trench 320, at least part of the surfaces of the trench 320 can be treated with plasma to make the trench 320 ready for the deposition, e.g., by removing contaminants from the surfaces of the trench 320. As another example, the chamber can provide plasmas after the fluid 355 is sprayed into the trench 320. The plasma facilitates solidification or crystallization of the semiconductor material in the trench 320. In other embodiments, the solidification or crystallization can be done through radiation, heat, or other methods.

The BL 360 may be formed through epitaxial growth, such as homoepitaxial growth (e.g., in embodiments where the BL 360 has the same semiconductor material as the substrate 310), heteroepitaxial growth (e.g., in embodiments where the BL 360 has a different semiconductor material from the substrate 310), etc. The trench 320 may constitute a topographical guiding pattern for the epitaxial growth of the BL 360. The topographical guiding pattern can direct crystal growth of semiconductors. The trench 320 can promote epitaxial growth in one direction and inhibit epitaxial growth in other directions. For instance, the crystallization rate of the semiconductor material along the orientation of the longitudinal axis of the trench 320 (or the Z-axis) is higher than the crystallization rate of the semiconductor material in other directions.

The BL 360 is conductive. In some embodiments, the BL 360 may be doped with dopants. The dopants may be added into the fluid 355 or be incorporated into the semiconductor material after the epitaxial growth of the semiconductor material in the trench 320. The BL 360 may be defective. In some embodiments, there are cracks in the BL 360. The dimensions and shape of the trench 320 can be determined so that the defects are "trapped" in the BL 360 and would not extend into another structure, e.g., a semiconductor structured formed over the BL 360. The BL 360 is an embodiment of the first region 120 in FIG. 1.

Figure 4:
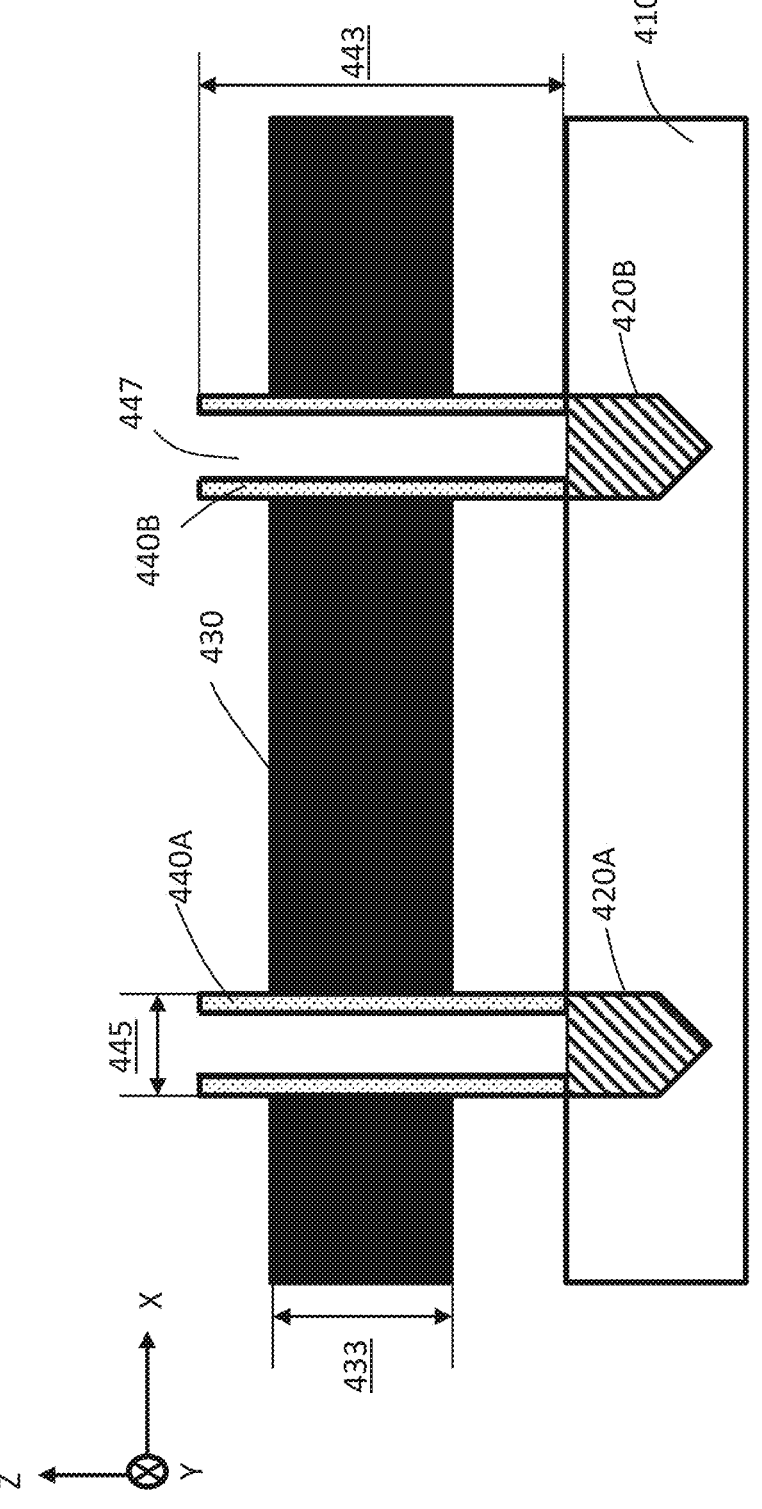
FIG. 4 illustrates gates of vertical transistors, according to some embodiments of the disclosure.

FIG. 4 illustrates gates of vertical transistors, according to some embodiments of the disclosure. FIG. 4 shows a substrate 410, BLs 420A and 420B (collectively referred to as "BLs 420" or "BL 420") in the substrate 410, a WL 430, and gate insulators 440A and 440B (collectively referred to as "gate insulators 440" or "gate insulator 440"). The substrate 410 may be the same or similar as the substrate 110, 210, or 310. A BL 420 may be the same or similar as the first region 120 or BL 320.

The WL 430 and a gate insulator 440 constitute a gate of a vertical transistor. The WL 430 is over the substrate 410. The WL 430 electrically conductive and may be formed of any suitable electrically conductive material. The WL 430 can be coupled to a gate terminal that controls a gate potential of the vertical transistors 105. The WL 430 may be an elongated structure that has a longitudinal axis along the X-axis and a transvers cross-section in a Y-Z plane. The WL 430 is coupled to the BLs 420. A BL 420 may have a longitudinal axis that is orthogonal to the longitudinal axis of the WL 430. For instance, the longitudinal axis of the BL 420 is along the Y-axis. The WL 430 may be formed through deposition of an electrically conductive material.

A gate insulator 440 includes an electrical insulator such as a dielectric material, hysteretic material, and so on. The gate insulator 440 is formed over each BL 420. A width 445 of the gate insulator 440 along the X-axis may be the same or substantially same as the width of the BL 420 along the X-axis. The gate insulator 440 may be an elongated hollow structure, where an opening 447 is surround by the gate insulator 440 and the gate insulator 440 forms the side wall of the opening 447. The gate insulator 440 may have a longitudinal axis along the Z-axis and a transvers cross-section in a X-Y plane. In some embodiments, a cross-section of the gate insulator 440 in a X-Y plane has a circular shape. In other embodiments, the cross-section of the gate insulator 440 can have other shapes, such as rectangular, triangle, oval, and so on.

The gate insulator 440 crosses the WL 430. The WL 430 wraps around a portion of the gate insulator 440. A shown in FIG. 4, the gate insulator 440 also includes a portion above the WL 430 and a portion below the WL 430. A dimension 547 of the gate insulator 440 along the Z-axis is larger than a dimension 537 of the WL 430 along the Z-axis. In other embodiments, the dimension 547 of the gate insulator 440 may be the equal or substantially equal to the dimension 537 of the WL 430.

In some embodiments, openings are formed in the WL 430, e.g., through etching. Then the gate insulator 440s are formed based on the openings. In some embodiments, a gate insulator 440 may be deposited using a conformal deposition process, such as atomic layer deposition (ALD) or chemical vapor deposition (CVD). Conformal deposition generally refers to deposition of a certain coating on any exposed surface of a given structure. A conformal coating may, therefore, be understood as a coating that is applied to exposed surfaces of a given structure, and not, for example, just to the vertical surfaces. In some embodiments, an annealing process may be carried out on the gate insulator 440 to improve the quality of the gate insulator 440.

Figure 5A:
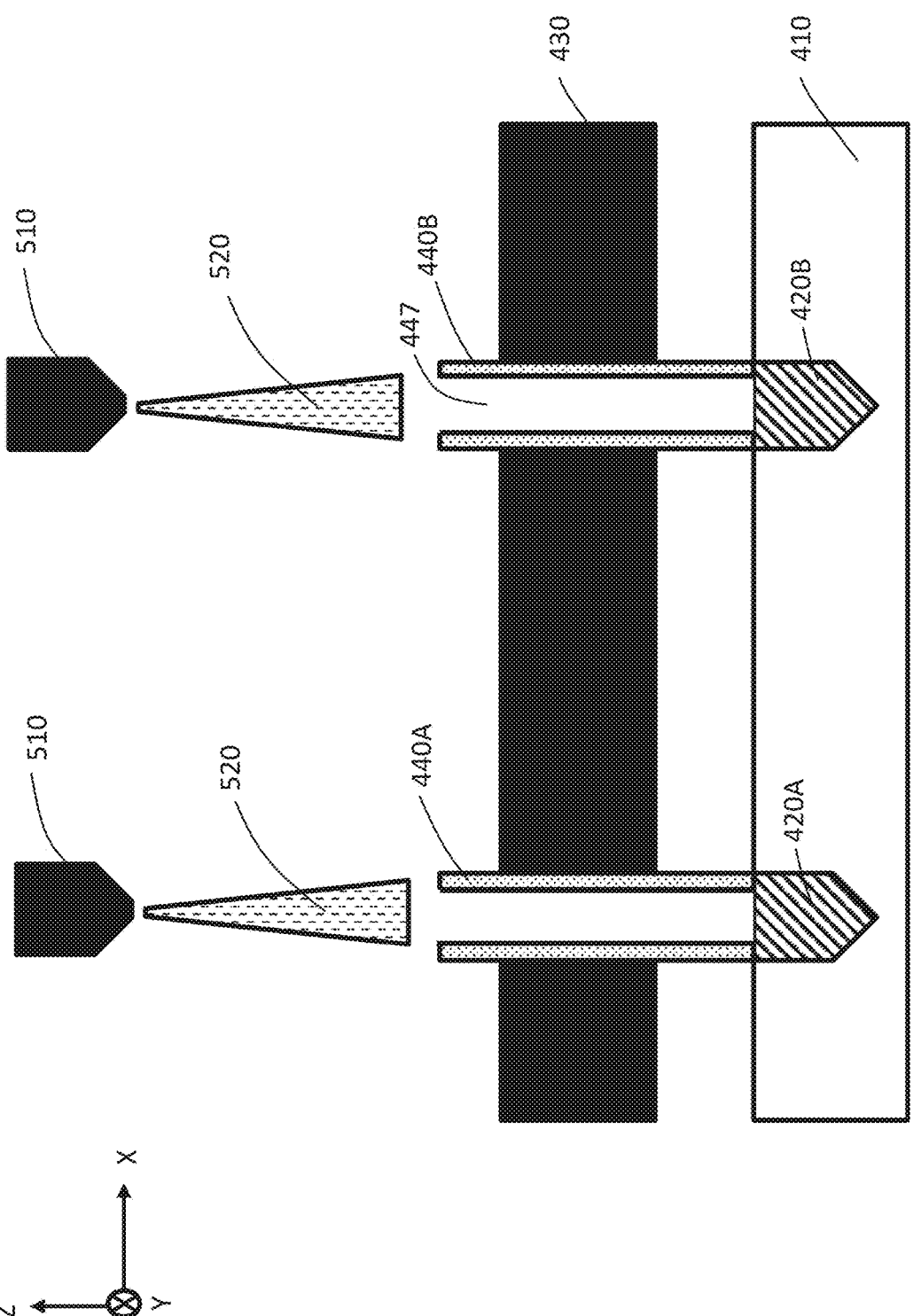
FIGS. 5A and 5B illustrate formation of channel regions of vertical transistors, according to some embodiments of the disclosure.
Figure 5B:
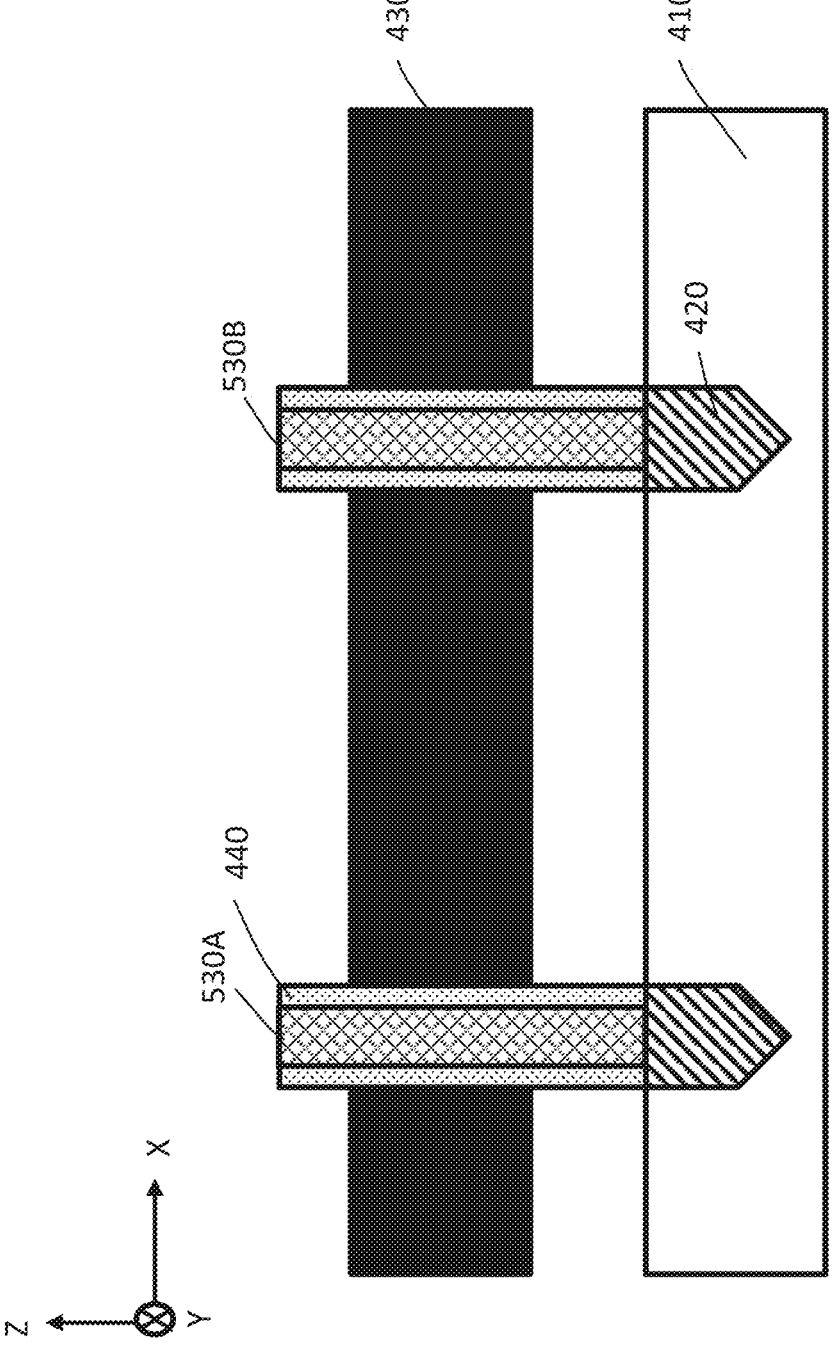

FIGS. 5A and 5B illustrate formation of channel regions 530A and 530B of vertical transistors, according to some embodiments of the disclosure. The channel regions 530A and 530B (collectively referred to as "channel regions 530" or "channel region 530") are formed based on the gates, substrate 410, and BLs 420 in FIG. 4. In FIG. 5A, a spraying assembly 510 sprays a fluid 520 into the opening 447 of each gate insulator 440. In FIG. 5B, the channel regions 530 are formed in the two openings 447, respectively. A channel region 530 is formed on the top surface of a BL 420. A channel region 530 may fill up the whole opening 447 or most of the opening 447. The channel region 530 may have one or more dimensions and shape of the opening 447.

The fluid 520 may be a gas, liquid, or supercritical fluid. The fluid 520 includes one or more precursors of a semiconductor material. A precursor may include the semiconductor material or one or more chemical elements of the semiconductor material. The semiconductor material may be formed through a chemical reaction between multiple precursors, chemical reaction between a precursor and a material on the top surface of the BL 420, chemical reaction between a precursor and a material in the environment (e.g., a deposition chamber), or some combination thereof.

In some embodiments, the spraying of the fluid 520 is performed in a chamber. The chamber may provide a controlled environment with a predetermined temperature or pressure. For example, the chamber provides a vacuum environment (e.g., a pressure of $10^{-8}$-$10^{-12}$ Torr) to prevent contamination. As another example, the chamber has a temperature and pressures to maintain the phase of the precursor, which may be gas, liquid, or superfluid. In some embodiments, the chamber may include plasma that facilitates the spraying of the fluid 520. For example, before the fluid 520 is sprayed into the opening 447 of the gate insulator 440, at least part of the internal surface of the gate insulator 440 can be treated with plasma to make the surface ready for the deposition, e.g., by removing contaminants from the surfaces. As another example, the chamber can provide plasmas after the fluid 520 is sprayed. The plasma facilitates solidification or crystallization of the semiconductor material in the opening 447. In other embodiments, the solidification or crystallization can be done through radiation, heat, or other methods.

A channel region 530 may be formed through epitaxial growth, such as homoepitaxial growth (e.g., in embodiments where the BL 420 has the same semiconductor material as the channel region 530), heteroepitaxial growth (e.g., in embodiments where the BL 420 has a different semiconductor material from the channel region 530), etc. The gate insulator 440 may constitute a topographical guiding pattern for the epitaxial growth of the channel region 530. The topographical guiding pattern can direct crystal growth of semiconductors. The gate insulator 440 can promote epitaxial growth in one direction and inhibit epitaxial growth in other directions. For instance, the crystallization rate of the semiconductor material along the orientation of the longitudinal axis of the gate insulator 440 (i.e., the Z-axis) is higher than the crystallization rate of the semiconductor material in other directions.

In some embodiments, a seed layer may be formed on the top surface of the BL 420 and inside the opening 447 of the gate insulator 440. The seed layer can function as a chemical guiding pattern for the epitaxial growth of the channel region 530 and orient the crystal growth of the channel region 530. For instance, the seed layer can align a crystal orientation of the channel region 530 with a particular direction, e.g., along the Z-axis. In some embodiments, the seed layer includes oriented grains of a material. The seed layer may be formed by depositing a small amount of the material, heating the top surface of the BL 420 to form isolated oriented grains, and then using these grains as seeds for the deposition of an oriented layer. The seed layer may have a thickness less than 1 μm.

In the embodiment of FIGS. 5A and 5B, the channel regions 530 are formed after the WL 430 and gate insulators 440 are formed. In some embodiments, the channel regions 530 may be formed before the WL 430 or gate insulators 440 are formed. In an example, the channel regions 530 are formed, e.g., through epitaxy or layer transfer, on the BLs 420 after the BLs 420 are formed in the substrate 410. After the channel regions 530 are formed, the gate insulators 440 are formed. A gate insulator 440 may be formed by depositing the electrical insulator material on the surface of the channel region 530. Further, the WL 430 can be formed and coupled to the gate insulators 440, e.g., through deposition of an electrically conductive material and etching.

FIGS. 6A-6C illustrate a process of forming semiconductor structures 620 (individually referred to as "semiconductor structure 620") over the channel regions 530 in FIGS. 5A and 5B, according to some embodiments of the disclosure. The process includes layer transfer. Layer transfer includes transferring a layer (e.g., a layer of a semiconductor material) from a growth substrate (e.g., a substrate on which the layer is deposited) to a target substrate. FIG. 6A shows a growth substrate 610. The growth substrate 610 may be any suitable structure on which a semiconductor structure can be grown. The growth substrate 610 may be semiconductor substrate that includes a semiconductor material. Alternatively, the growth substrate 610 may include other materials, such as glass. The growth substrate 610 may include the same material as the substrate 410. In various embodiments, the growth substrate 610 may include any such substrate material that provides a suitable surface for forming the semiconductor layer.

In FIG. 6B, a semiconductor structure 620 is formed on the growth substrate 610, which generates a structure 630. The semiconductor structure 620 includes a semiconductor material with dopants. The semiconductor structure 620 may be an embodiment of the second region 140 in FIG. 1. The semiconductor structure 620 may be formed by depositing the semiconductor material onto the growth substrate 610. Various deposition techniques can be used, including, e.g., ALD, CVD, physical vapor deposition (PVD), etc. Dopants (e.g., n-type dopant or p-type dopant) can be incorporated into the semiconductor material before, during, or after the formation of the semiconductor structure 620. In an embodiment, the dopant is mixed with a precursor of the semiconductor material and the mixture is sprayed onto the growth substrate 610 to form the semiconductor structure 620. In another embodiment, the dopant is incorporated into the semiconductor material after the semiconductor structure 620 is formed on the growth substrate 610. Even though the semiconductor structure 620 is below the growth substrate 610 in FIG. 6B, the semiconductor structure 620 may be formed on top of the growth substrate 610, after which the structure 630 is flipped over.

In FIG. 6C, the structure 630 is bonded to each channel region 530 with the semiconductor structure 620 touching the channel region 530. As shown in FIG. 6C, the semiconductor structure 620 also touches the gate insulator 440. In other embodiments, the semiconductor structure 620 may not touch the gate insulator 440. In some embodiments, the structure 630 and the channel region 530 are bonded together through a thermal compression process. For instance, the structure 630 and channel region 530 are compressed at a predetermined temperature for a predetermined duration of time to form a bonding between the semiconductor structure 620 and the channel region 530. The temperature and duration of time can be determined based on the materials of the semiconductor structure 620 and channel region 530.

In some embodiments, an adhesive layer (not shown in FIG. 6C) is used to facilitate the bonding. The adhesive layer may be formed on a surface of the semiconductor structure 620 or a surface of the channel region 530, e.g., through spin coating. The adhesive layer may be in a flowable state. The heating during the thermal compression can harden the adhesive layer and form a stable bond between the semiconductor structure 620 and the channel region 530. An example of the adhesive layer is a hydrogen silsesquioxane (HSQ) layer. In the embodiment of FIG. 6C, the semiconductor structure 620 is bonded to both channel regions 530. In other embodiments, different semiconductor structures may be bonded to the two channel regions 530. For instance, the semiconductor structure bonded to the channel region 530A has dopants of an opposite type from the semiconductor structure bonded to the channel region 530B.

Figure 6D:
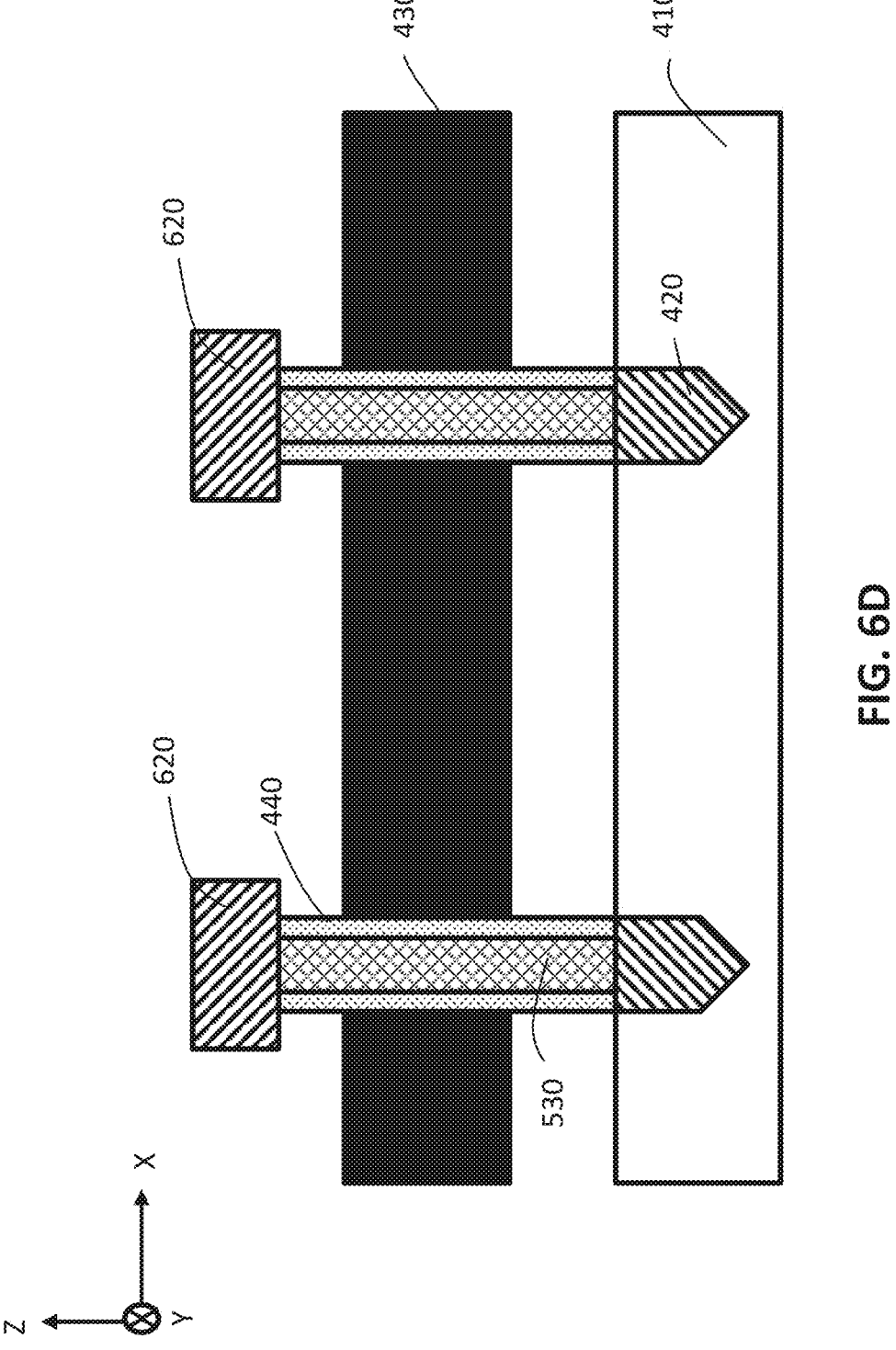

After the bonding process, the growth substrate 610 is removed from the structure 630, which is shown in FIG. 6D. The growth substrate 610 can be removed through various techniques, such as etching, mechanical thinning, epitaxial lift-off, mechanical spalling, laser lift-off, ion cutting, and so on. Through the steps in FIGS. 6B-6D, the semiconductor structure 620 is "transferred" from the growth substrate 630 to the channel region 530, i.e., the target substrate.

In some embodiments, the semiconductor structure 620 and the channel region 530 have different semiconductor materials by may have aligned crystal orientations (i.e., their crystal orientations are in parallel). The crystal orientation of the semiconductor structure 620 can be determined by the growth substrate 610. For instance, the semiconductor structure 620 can be formed through homoepitaxial growth if the semiconductor structure 620 and the growth substrate 610 have the same material. With homoepitaxial growth, the crystal structure of the semiconductor structure 620 can match (e.g., identical or substantially identical to) the crystal structure of the growth substrate 610 and the crystal orientation of the semiconductor structure 620 can be aligned with the crystal orientation of the growth substrate 610, i.e., the two crystal orientations can be the same or substantially same. That way, even if the semiconductor structure 620 and the channel region 530 have different materials, their crystal orientations can still be aligned by aligning the crystal orientation of the growth substrate 610 with the crystal orientation of the channel region 530. Such layer transfer processes can allow the integration of both lattice-matched and mismatched materials for enabling extended functionality and performance by assembling diverse materials or devices in a more compact space.

Figure 7A:
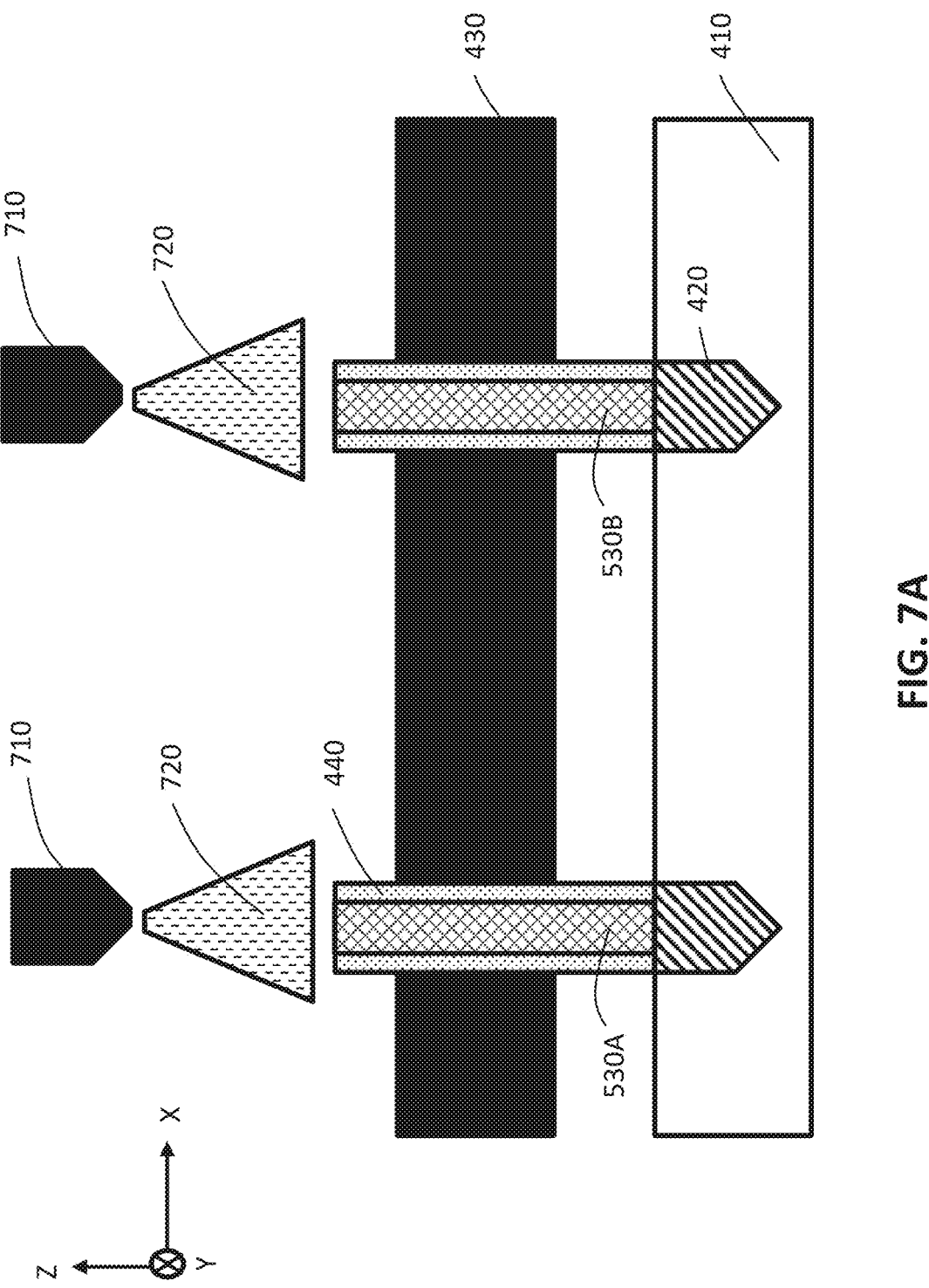
FIGS. 7A and 7B illustrate another process of forming semiconductor structures over the channel regions in FIGS. 5A and 5B, according to some embodiments of the disclosure.
Figure 7B:
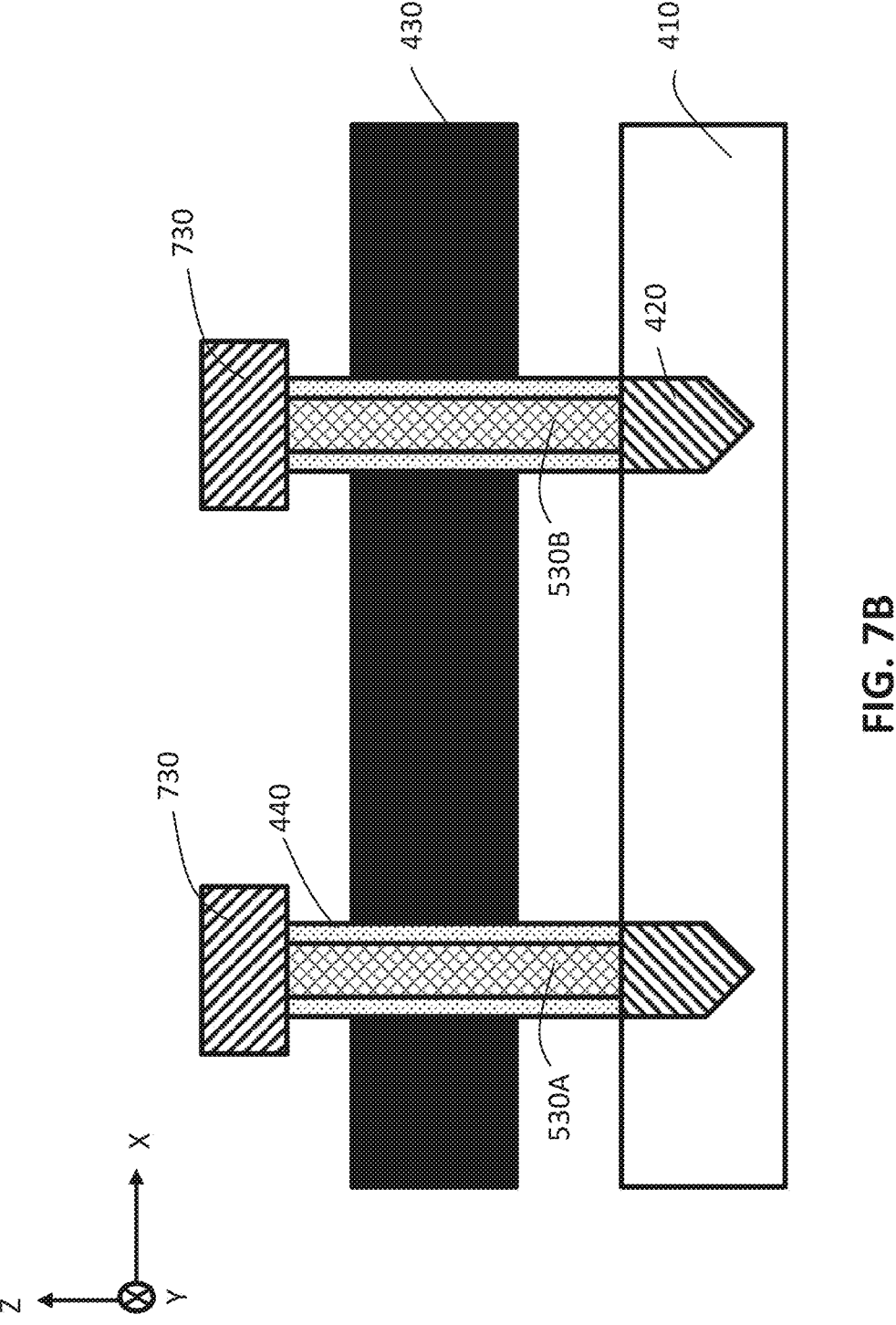

FIGS. 7A and 7B illustrate another process of forming semiconductor structures 730 (individually referred to as "semiconductor structure 730") over the channel regions 530, according to some embodiments of the disclosure. The process in FIGS. 7A and 7B includes epitaxy. The epitaxy includes crystal growth of a semiconductor material on an underlying layer. The epitaxy may be a liquid phase epitaxy, a molecular beam epitaxy, a CVD epitaxy (e.g., metalorganic CVD epitaxy), etc.

In FIG. 7A, a spraying assembly 710 sprays a fluid 720 onto each channel region 530. In FIG. 7B, the semiconductor structures 730 are on the two channel regions 530, respectively. A semiconductor structure 730 is formed on the top surface of a channel region 530. The fluid 720 may be a gas, liquid, or supercritical fluid. The fluid 720 includes one or more precursors of a semiconductor material. A precursor may include the semiconductor material or one or more chemical elements of the semiconductor material. The semiconductor material may be formed through a chemical reaction between multiple precursors, chemical reaction between a precursor and a material on the top surface of the BL 420, chemical reaction between a precursor and a material in the environment (e.g., a deposition chamber), or some combination thereof. In some embodiments, the fluid 720 also includes other materials, such as n-type dopants, or p-type dopants.

In some embodiments, the spraying of the fluid 720 is performed in a chamber. The chamber may provide a controlled environment with a predetermined temperature or pressure. For example, the chamber provides a vacuum environment (e.g., a pressure of $10^{-8}$-$10^{-12}$ Torr) to prevent contamination. As another example, the chamber has a temperature and pressures to maintain the phase of the precursor, which may be gas, liquid, or superfluid. In some embodiments, the chamber may include plasma that facilitates the spraying of the fluid 720. For example, before the fluid 720 is sprayed onto the top surface of the channel region 530, at least part of the top surface of the channel region 530 can be treated with plasma to make the surface ready for the deposition, e.g., by removing contaminants from the surface. As another example, the chamber can provide plasmas after the fluid 720 is sprayed. The plasma facilitates solidification or crystallization of the semiconductor material on the top surface of the channel region 530. In other embodiments, the solidification or crystallization can be done through radiation, heat, or other methods.

A semiconductor structure 730 may be formed through epitaxial growth, such as homoepitaxial growth (e.g., in embodiments where the channel region 530 has the same semiconductor material as the semiconductor structure 730), heteroepitaxial growth (e.g., in embodiments where the channel region 530 has a different semiconductor material from the semiconductor structure 730), etc. The semiconductor structure 730 may be an embodiment of the second region 140 in FIG. 1. In some embodiments, the semiconductor structure 730 and channel region 530 may have different semiconductor materials and unaligned crystal orientations.

In other embodiments, the semiconductor structure 730 and channel region 530 may have different semiconductor materials but aligned crystal orientations. In an example, a seed layer may be formed on the top surface of the channel region 530. The seed layer can function as a chemical guiding pattern for the epitaxial growth of the semiconductor structure 730 and orient the crystal growth of the semiconductor structure 730. For instance, the seed layer can align a crystal orientation of the semiconductor structure 730 with a particular direction, e.g., the crystal orientation of the channel region 530. In some embodiments, the seed layer includes oriented grains of a material. That way, the crystal orientation of the semiconductor structure 730 can be aligned with the e crystal orientation of the channel region 530 by aligning the orientation of the grains in the seed layer with the crystal orientation of the channel region 530. In other embodiments, the orientation of the grains in the seed layer may be aligned with a different direction. The seed layer may be formed by depositing a small amount of the material, heating the top surface of the channel region 530 to form isolated oriented grains, and then using these grains as seeds for the deposition of an oriented layer. The seed layer may have a thickness less than 1 μm.

In some embodiments, the dimension 547 of the gate insulator 440 is larger than the dimension 537 of the channel region 530 and the gate insulator 440 extends beyond the top surface of the channel region 530. That way, the opening 447 can function as a topographical guiding pattern for the epitaxial growth of the semiconductor structure 730. At least a portion of the semiconductor structure 730 would be wrapped around by the gate insulator 440.

In the embodiment of FIGS. 7A and 7B, same semiconductor structures 730 are formed on the channel regions 530. In other embodiments, different semiconductor structures may be formed on the two channel regions 530. For instance, the semiconductor structure formed the channel region 530A has dopants of an opposite type from the semiconductor structure formed on the channel region 530B.

Figure 8:
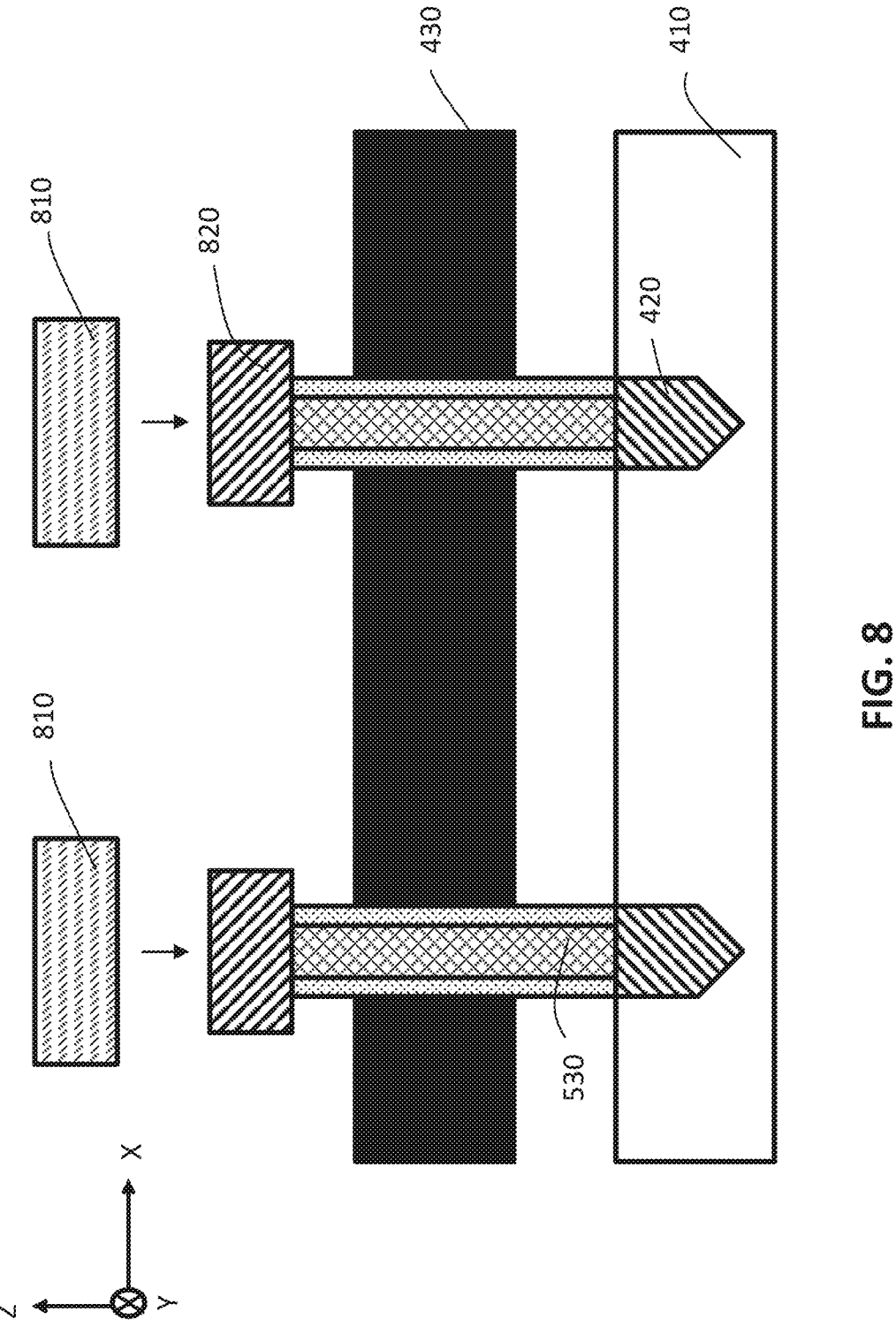
FIG. 8 illustrates coupling memory elements with vertical transistors, according to some embodiments of the disclosure.

FIG. 8 illustrates coupling memory elements 810 (individually referred to as "memory element 810") with vertical transistors, according to some embodiments of the disclosure. A memory element 810 may be a transistor. For each vertical transistor, the memory element 810 is connected to a region 820 of the vertical transistor. The region 820 may be the drain region of the vertical transistor. In the embodiment of FIG. 8, same memory elements 810 are coupled to the two regions 820. In other embodiments, different semiconductor structures may be formed on the two regions 820. The memory element 810 may be an embodiment of the memory element 170 in FIG. 1. The region 820 may be an embodiment of the second region 140 in FIG. 1.

Example Method of Forming an IC Device

FIG. 9 is a flowchart showing a method 900 of forming an IC device, in accordance with various embodiments. In some embodiments, the method 900 includes instructions that are stored in one or more non-transitory computer-readable media and are executable by a processing device, e.g., the processing device 2402 in FIG. 14. Although the method 900 is described with reference to the flowchart illustrated in FIG. 9, many other methods for forming IC devices may alternatively be used. For example, the order of execution of the steps in FIG. 9 may be changed. As another example, some of the steps may be changed, eliminated, or combined.

The method 900 includes providing 910 a trench in a substrate. A portion of a cross-section of the trench having a V shape. In some embodiments, a ratio of a first dimension of the trench along a first direction to a second dimension of the trench along a second direction is in a range from 0.5 to 10. The first direction is orthogonal to the second direction. The trench may be formed by etching the substrate.

The method 900 includes providing 920 a first region in the trench with a first semiconductor material and first dopants. The first region is one of a source region and a drain region of a transistor. The transistor may be a FET, such as MOSFET or TFET. In some embodiments, the first region is formed in the trench through epitaxial growth. The epitaxial growth may be guided by the shape or orientation of the trench. A mixture of a precursor of the first semiconductor material and the first dopants can be provided, e.g., sprayed, into the trench.

The method 900 includes providing 930 a channel region over the first region with a second semiconductor material. In some embodiments, the channel region has an elongated structure, such as a nanowire, nanoribbon, fin, etc. A number of cracks per unit volume of the first region is larger than a number of cracks per unit volume of the channel region.

The method 900 includes providing 940 a second region over the channel region with a third semiconductor material and second dopants. The first semiconductor material may be the same as the second semiconductor material or the third semiconductor material. The second region is the other one of the source region and the drain region of a transistor. In some embodiments (e.g., embodiments where the transistor is a MOSFET), the second region includes dopants of the same type as the first region. In other embodiments (e.g., embodiments where the transistor is a TFET), the second dopants are of the same type as the first dopants. In some embodiments, the second region is formed by providing a mixture of a precursor of the third semiconductor material and the second dopants onto a surface of the channel region. In other embodiments, the second region may be transferred from a substrate to the channel region. For instance, the second region is provided over the substrate (e.g., formed on the substrate) to form a combined structure that includes the second region and the substrate. The combined structure is bonded to the channel region with the second region contacting the channel region. Then the substrate is removed.

The method 900 includes providing 950 an insulator. The insulator wraps around at least a portion of the channel region. In some embodiments, the insulator is formed before the channel region. The channel region can be formed by spraying a precursor of a channel material into an opening formed by the insulator. The opening may be on a surface of the first region. In other embodiments, the insulator is formed after the channel region. The insulator can be formed by depositing an electrically insulating material on a surface (or surfaces) of the channel region.

The method 900 includes providing 960 an electrode. The electrode wraps around at least a portion of the insulator. In some embodiments, the electrode is a WL of a memory device. The first region is a BL of the memory device. Also, the second region can be coupled to a memory element, e.g., a transistor, to constitute a 1T-1X memory cell. The memory cell may be a SRMA memory cell, DRMA memory cell, etc.

Example Memory Array

Figure 10:
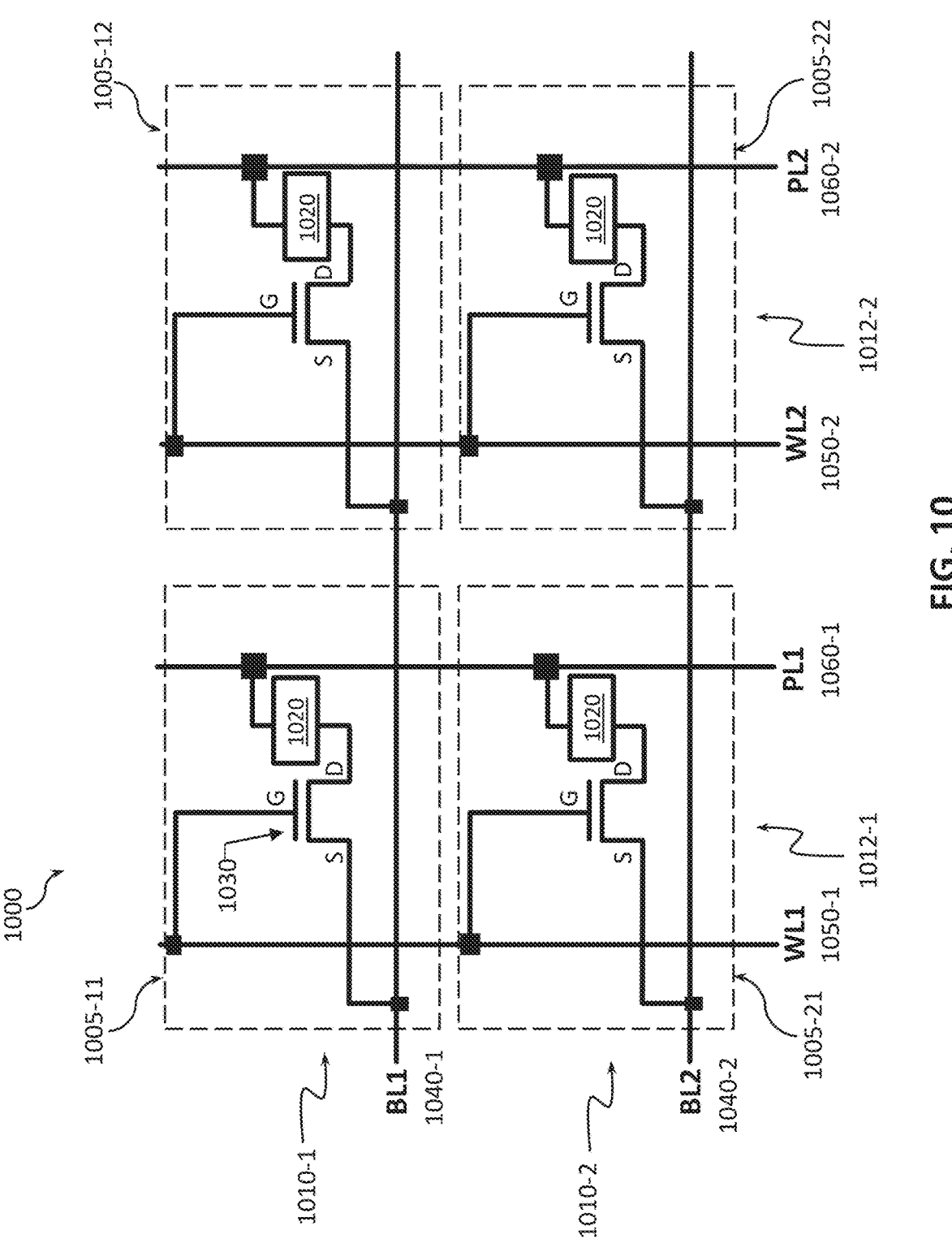
FIG. 10 is an electric circuit diagram of a memory array, according to some embodiments of the present disclosure.

FIG. 10 is an electric circuit diagram of a memory array 1000, according to some embodiments of the present disclosure. The memory array 1000 is an array of memory cells 1005-11, 1005-12, 1005-21, and 1005-22 (collectively referred to as "memory cells 1005" or "memory cell 1005"), which are arranged in rows 1010-1 and 1010-2 (collectively referred to as "rows 1010" or "row 1010") and columns 1012-1 and 1012-2 (collectively referred to as "columns 1012" or "column 1012"). Each memory cell 1005 is illustrated within one of the dashed boxes in FIG. 10.

The memory array 1000 also includes three types of control lines: BLs 1040-1 and 1040-2 (collectively referred to as "BLs 1040" or "BL 1040"), WLs 1050-1 and 1050-2 (collectively referred to as "WLs 1050" or "WL 1050"), and platelines (PLs) 1060-1 and 1060-2 (collectively referred to as "PLs 1060" or "PL 1060"), which control the memory cells 1005. The memory cells 1005 in the row 1010-1 are coupled to the same BL 1040-1. The memory cells in the row 1010-1 are coupled to the same BL 1040-2. The memory cells in the column 1012-1 are coupled to the same WL 1050-2 and the same PL 1060-2. The memory cells in the column 1012-2 are coupled to the same WL 1050-1 and the same PL 1060-1. As is conventionally used in context of memory, the terms "row" and "column" do not reflect the, respectively, horizontal and vertical orientation on a page of a drawing illustrating a memory array but, instead, reflect how individual memory cells are addressed. Namely, memory cells 1005 sharing a single BL 1040 are said to be in the same row, while memory cells sharing a single WL 1050 and a single PL 1060 are said to be on the same column. In other embodiments, the memory array 1000 may include a different number of memory cells, BLs, WLs, or PLs. Furthermore, in other embodiments, the memory cells 1005 may be arranged in arrays in a manner other than what is shown in FIG. 10, e.g., in any suitable manner of arranging memory cells into arrays as known in the art, all of which being within the scope of the present disclosure.

A memory cell 1005 may store one bit of binary information. Each memory cell 1005 is a 1T-1X memory cell. The memory cell 1005 includes a memory element 1020 and an access transistor 1030. The memory element 1020 is configured to store signals. The memory element 1020 may have more than one states. The memory element 1020 having two states may be referred to as a binary memory element. In other embodiments, the memory element 1020 may have more than two states. In some embodiments, the memory element 1020 is a capacitor that can store electrical voltage signals, and the memory cell 1005 is a one-transistor one-capacitor (1T-1C) memory cell. In other embodiments, the memory element 1020 may be, for example, a ferroelectric memory element, a magnetic storage element, a resistor, or another transistor, coupled to the access transistor 1030. Also, the memory element 1020 may store signals other than electrical voltage signals.

The access transistor 1030 controls access to the memory cell 1005. For instance, the access transistor 1030 controls access to write information to the memory cell 1005, access to read information from the memory cell 1005, or both. The access transistor 1030 has a gate terminal, a source terminal, and a drain terminal, indicated in the example of FIG. 10 as terminals G, S, and D, respectively. An embodiment of the access transistor 1030 may be a vertical transistor, such as the vertical transistor 105 described above in conjunction in FIG. 1.

The access transistor 1030 may be a nanowire-based or nanoribbon-based transistor (or, simply, a nanowire transistor or nanoribbon transistor). In a nanowire or nanoribbon transistor, a gate stack that may include a stack of one or more gate electrode metals and, optionally, a stack of one or more gate insulators may be provided around a portion of an elongated semiconductor structure called "nanowire or nanoribbon", forming a gate on all sides of the nanowire or nanoribbon. The portion of the nanowire or nanoribbon around which the gate stack wraps around is referred to as a "channel" or a "channel portion." A semiconductor material of which the channel portion of the nanoribbon is formed is commonly referred to as a "channel material." A source region and a drain region are provided on the opposite ends of the nanowire or nanoribbon, on either side of the gate stack, forming, respectively, a source and a drain of such a transistor. Wrap-around or all-around gate transistors, such as nanoribbon and nanowire transistors, may provide advantages compared to other transistors having a non-planar architecture, such as FinFETs, and transistors having planar architecture. In the following, the terms "terminal" and "electrode" may be used interchangeably. Furthermore, for S/D terminals, the terms "terminal" and "region" may be used interchangeably.

As shown in FIG. 10, the gate terminal of the access transistor 1030 is coupled to a WL 1050, one of the S/D terminals of the access transistor 1030 is coupled to a BL 1040, and the other one of the S/D terminals of the access transistor 1030 is coupled to a first terminal of the memory element 1020, e.g., a first electrode of a capacitor. As also shown in FIG. 10, the other terminal of the memory element 1020 may be coupled to a capacitor PL 1060. As is known in the art, WL, BL, and PL may be used together to read and program the memory element 1020. In some embodiments (e.g., embodiments where the access transistor 1030 is the vertical transistor 105), a portion of the BL 1040 may be a S/D region of the access transistor 1030. Another S/D region of the access transistor 1030 is coupled to the memory element 1020. Also, a portion of the WL 1050 may be a gate electrode of the access transistor 1030. Such vertical transistors can improve the memory cell density of the memory array 1000 so that more memory cells can be arranged in the available space of the memory array 1000.

Each of the BL 1040, the WL 1050, and the PL 1060, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

In the embodiment of FIG. 10, a single PL 1060 is shared among multiple memory cells 1005 of a given row. The PLs 1060 are shared among the same memory cells 1005 among which the WL 1050 are shared. Such an arrangement where the PLs 1060 are shared among the same memory cells among which the WLs 1050 are shared may be described as an arrangement where the PLs 1060 are "parallel" to the WLs 1050. Each memory cell 1005 of the memory array 1000 where the PLs 1060 are parallel to the WLs 1050, e.g., as shown in FIG. 10, may then be addressed (e.g., to perform READ and WRITE operations) by using the WL 1050 and the PL 1060 corresponding to the column 1012 to which the memory cell 1005 belongs and by using the BL 1040 corresponding to the row 1010 to which the memory cell 1005 belongs.

It should be noted that, just as the horizontal and vertical orientations on a page of an electrical circuit diagram illustrating a memory array does imply functional division of memory cells into rows and columns as used in common language, the orientation of various elements on a page of an electrical circuit diagram illustrating a memory array does not imply that the same orientation is used for the actual physical layout of a memory array. For example, in an IC device implementing the memory array 1000 as shown in FIG. 2A, corresponding BLs 1040 and PLs 1060 (i.e., a pair of a BL 1040 and a PL 1060 coupled to a given column 1012) do not have to physically extend in a direction parallel to one another (although they may), or the WLs 1050 do not have to physically extend in a direction perpendicular to the BLs 1040 (although they may). In another example, in an IC device implementing the memory array 1000 as shown in FIG. 10, corresponding WLs 1050 and PLs 1060 (i.e., a pair of a WL 1050 and a PL 1060 coupled to a given column 1012) do not have to physically extend in a direction parallel to one another (although they may), or the WLs 1050 do not have to physically extend in a direction perpendicular to the BLs 1040 (although they may).

Example Wafer and Die

Figures 11A, 11B:
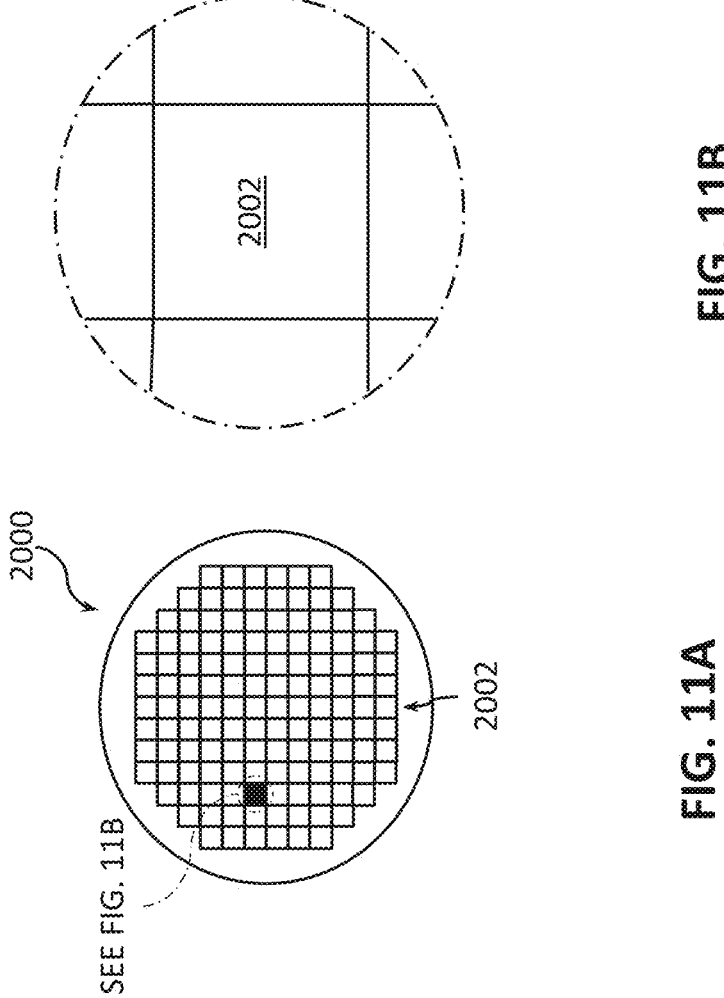
FIGS. 11A-11B are top views of a wafer and dies that may include one or more vertical transistors, according to some embodiments of the disclosure.

FIGS. 11A-11B are top views of a wafer 2000 and dies 2002 that may include one or more vertical transistors, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 12. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs including one or more vertical transistors as described herein). After the fabrication of the semiconductor product is complete (e.g., after manufacture of one or more vertical transistors as described herein), the wafer 2000 may undergo a singulation process in which each of the dies 2002 is separated from one another to provide discrete "chips" of the semiconductor product. In particular, devices that include one or more vertical transistors as disclosed herein may take the form of the wafer 2000 (e.g., not singulated) or the form of the die 2002 (e.g., singulated). The die 2002 may include one or more diodes, one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, an RF FE device, a memory device (e.g., a SRAM device), a logic device (e.g., an AND, OR, NAND, or NOR gate), or any other suitable circuit element. Multiple ones of these devices may be combined on a single die 2002.

Example IC Package

Figure 12:
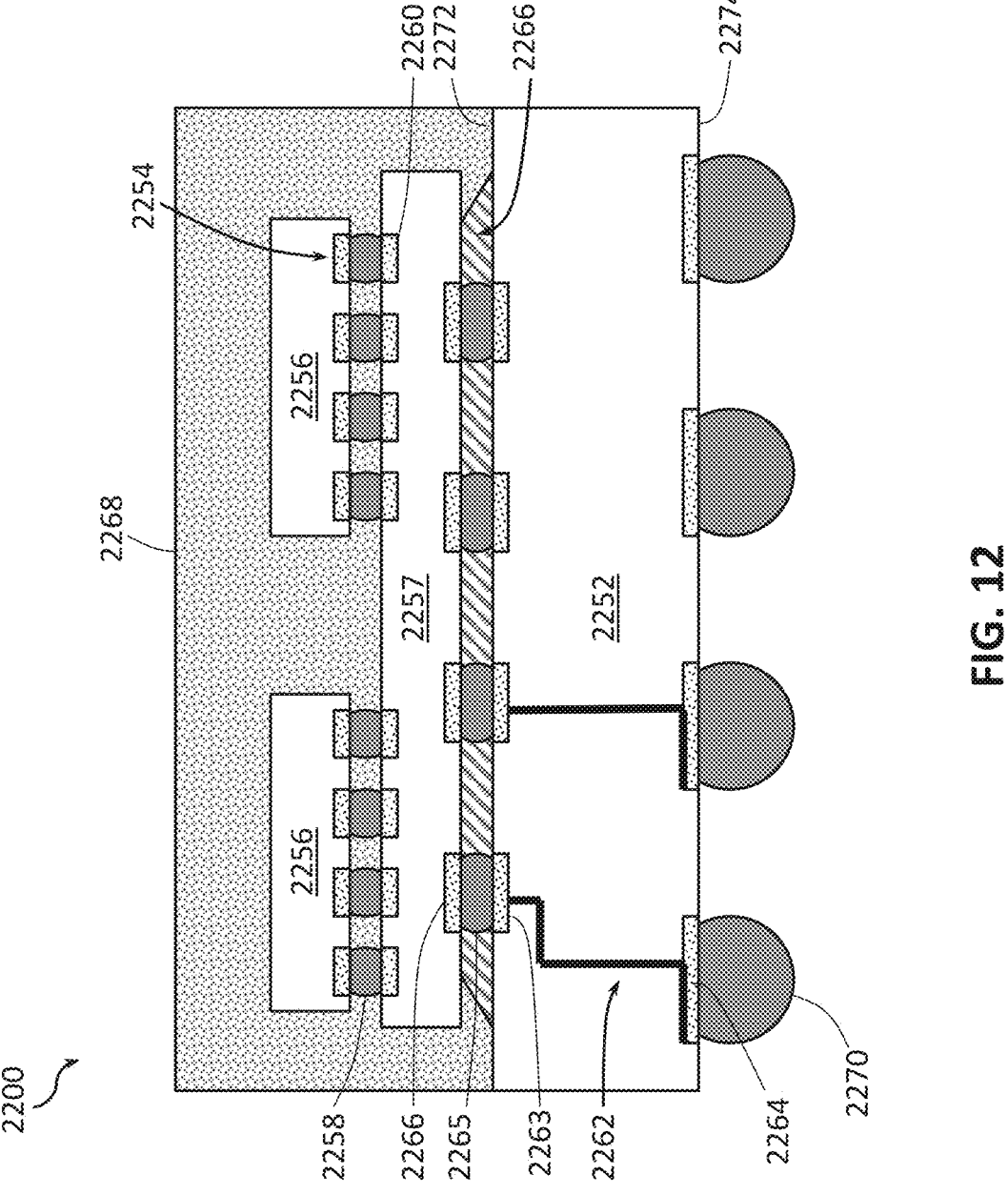
FIG. 12 is a side, cross-sectional view of an example IC package that may include one or more IC devices having vertical transistors, according to some embodiments of the disclosure.

FIG. 12 is a side, cross-sectional view of an example IC package 2200 that may include one or more IC devices having vertical transistors, according to some embodiments of the disclosure. In some embodiments, the IC package 2200 may be a system-in-package (SiP).

As shown in FIG. 12, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 12 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 12 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 12 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 13.

The dies 2256 may take the form of any of the embodiments of the die 2002 discussed herein and may include any of the embodiments of an IC device having one or more vertical transistors. In embodiments in which the IC package 2200 includes multiple dies 2256, the IC package 2200 may be referred to as a multi-chip package. Importantly, even in such embodiments of an MCP implementation of the IC package 2200, one or more vertical transistors may be provided in a single chip, in accordance with any of the embodiments described herein. The dies 2256 may include circuitry to perform any desired functionality. For example, one or more of the dies 2256 may be ESD protection dies, including one or more vertical transistors as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more vertical transistors, e.g., as discussed above; in some embodiments, at least some of the dies 2256 may not include any III-N diodes with n-doped wells and capping layers.

The IC package 2200 illustrated in FIG. 12 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although the dies 2256 are illustrated in the IC package 2200 of FIG. 12, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Example IC Device

Figure 13:
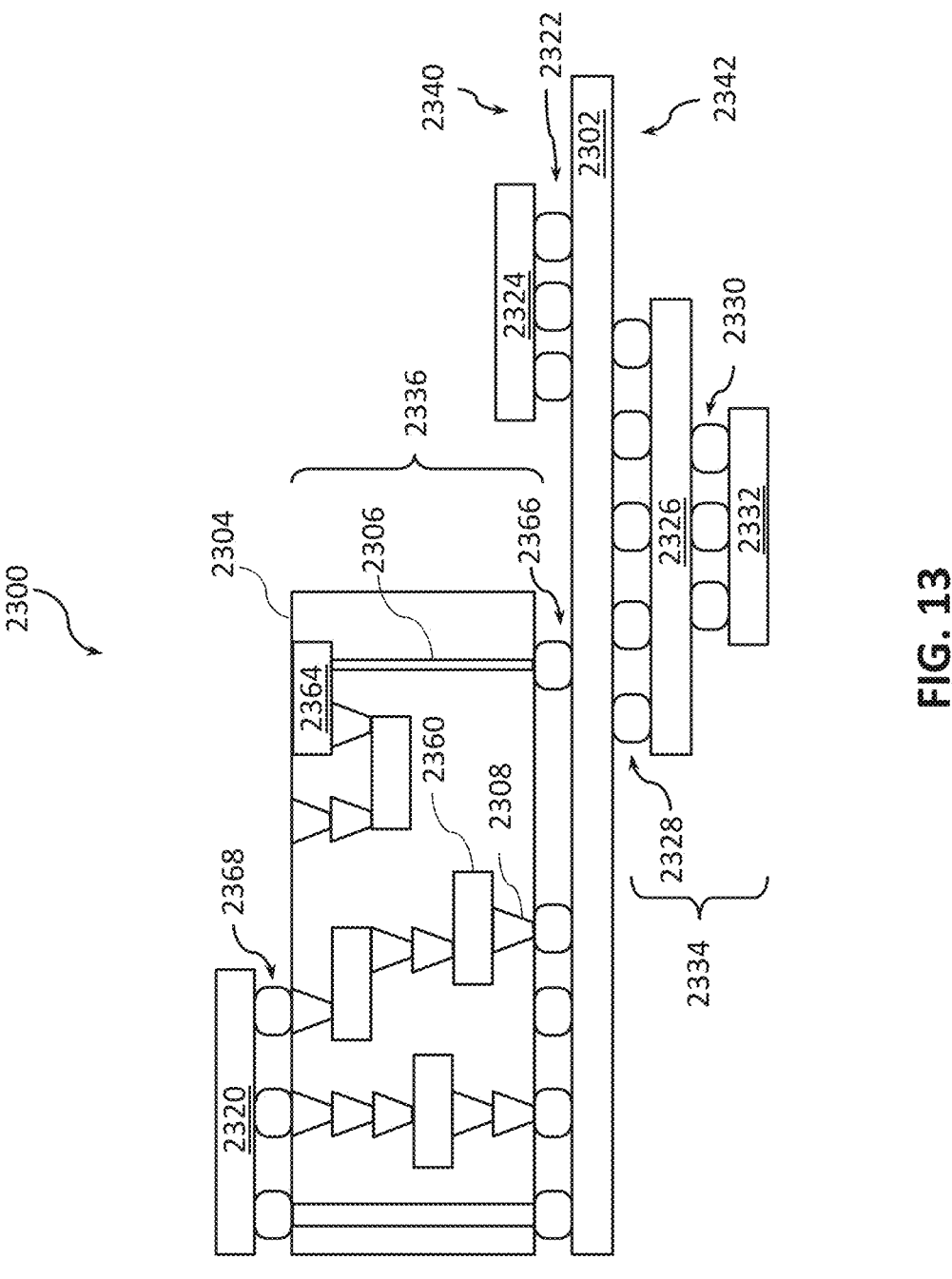
FIG. 13 is a cross-sectional side view of an IC device assembly that may include components having one or more IC devices implementing vertical transistors, according to some embodiments of the disclosure.

FIG. 13 is a cross-sectional side view of an IC device assembly 2300 that may include components having one or more IC devices implementing vertical transistors, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more vertical transistors in accordance with any of the embodiments disclosed herein; e.g., any of the IC packages discussed below with reference to the IC device assembly 2300 may take the form of any of the embodiments of the IC package 2200 discussed above with reference to FIG. 12 (e.g., may include one or more vertical transistors in/on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 13 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 13), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 11B), an IC device (e.g., the IC device of FIGS. 1-2), or any other suitable component. In particular, the IC package 2320 may include one or more vertical transistors as described herein. Although a single IC package 2320 is shown in FIG. 13, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 13, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other Group III-V and Group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more vertical transistors as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 13 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Example Computing Device

Figure 14:
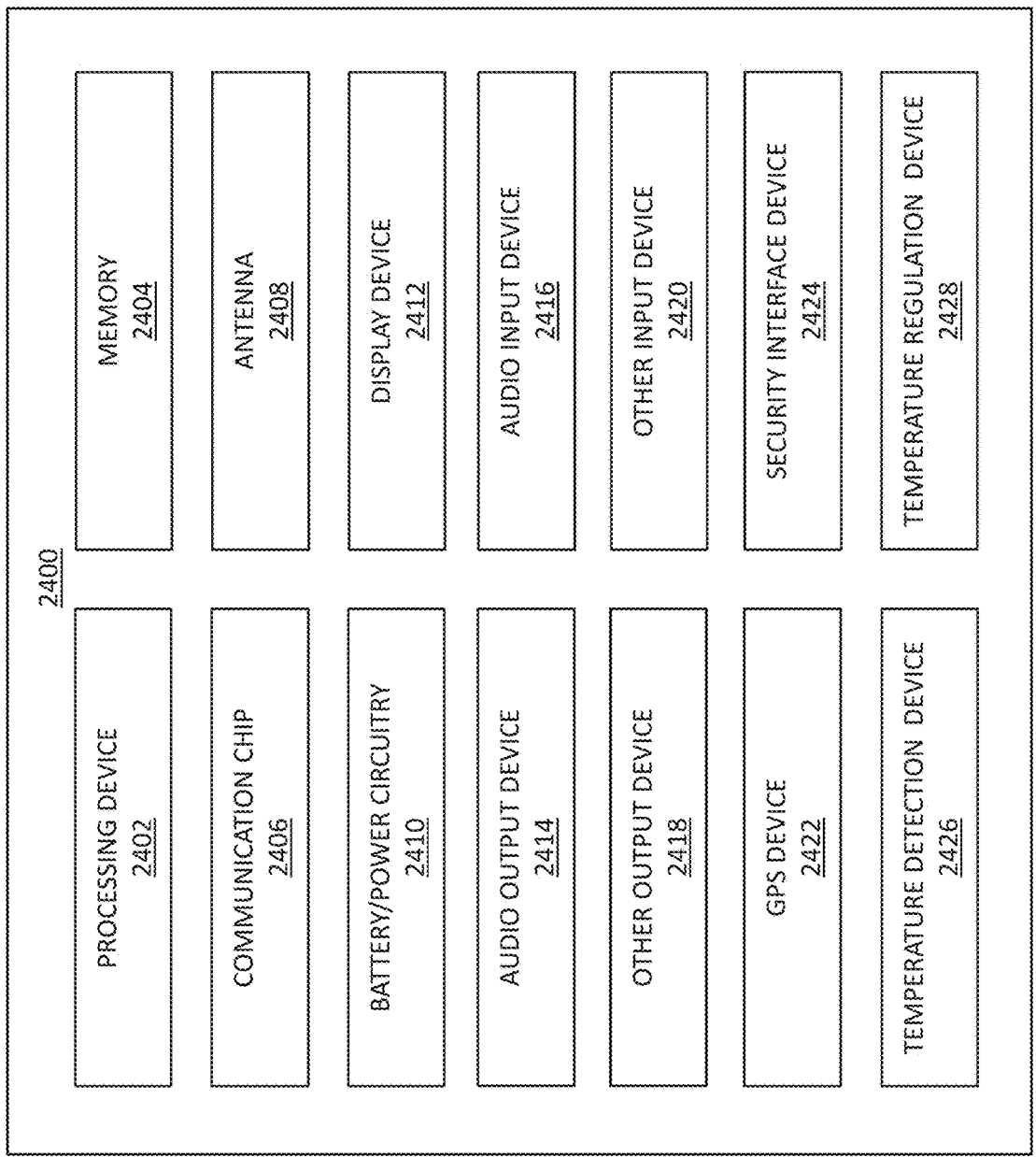
FIG. 14 is a block diagram of an example computing device that may include one or more components with vertical transistors, according to some embodiments of the disclosure.

FIG. 14 is a block diagram of an example computing device 2400 that may include one or more components including one or more vertical transistors in accordance with any of the embodiments disclosed herein. For example, any suitable ones of the components of the computing device 2400 may include a die (e.g., the die 2002 (FIG. 11B)) having one or more vertical transistors. Any one or more of the components of the computing device 2400 may include, or be included in, an IC device 2200 (FIG. 12). Any one or more of the components of the computing device 2400 may include, or be included in, an IC device assembly 2300 (FIG. 13).

A number of components are illustrated in FIG. 14 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 14, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM, nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque magnetic random-access memory (STT-M RAM).

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna 2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling device may have different locations within and around the computing device 2400. A cooling device of the temperature regulation device 2428 may be associated with one or more temperature sensors of the temperature detection device 2426 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related condition associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as a water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the computing efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy corelates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a net-book computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 15:
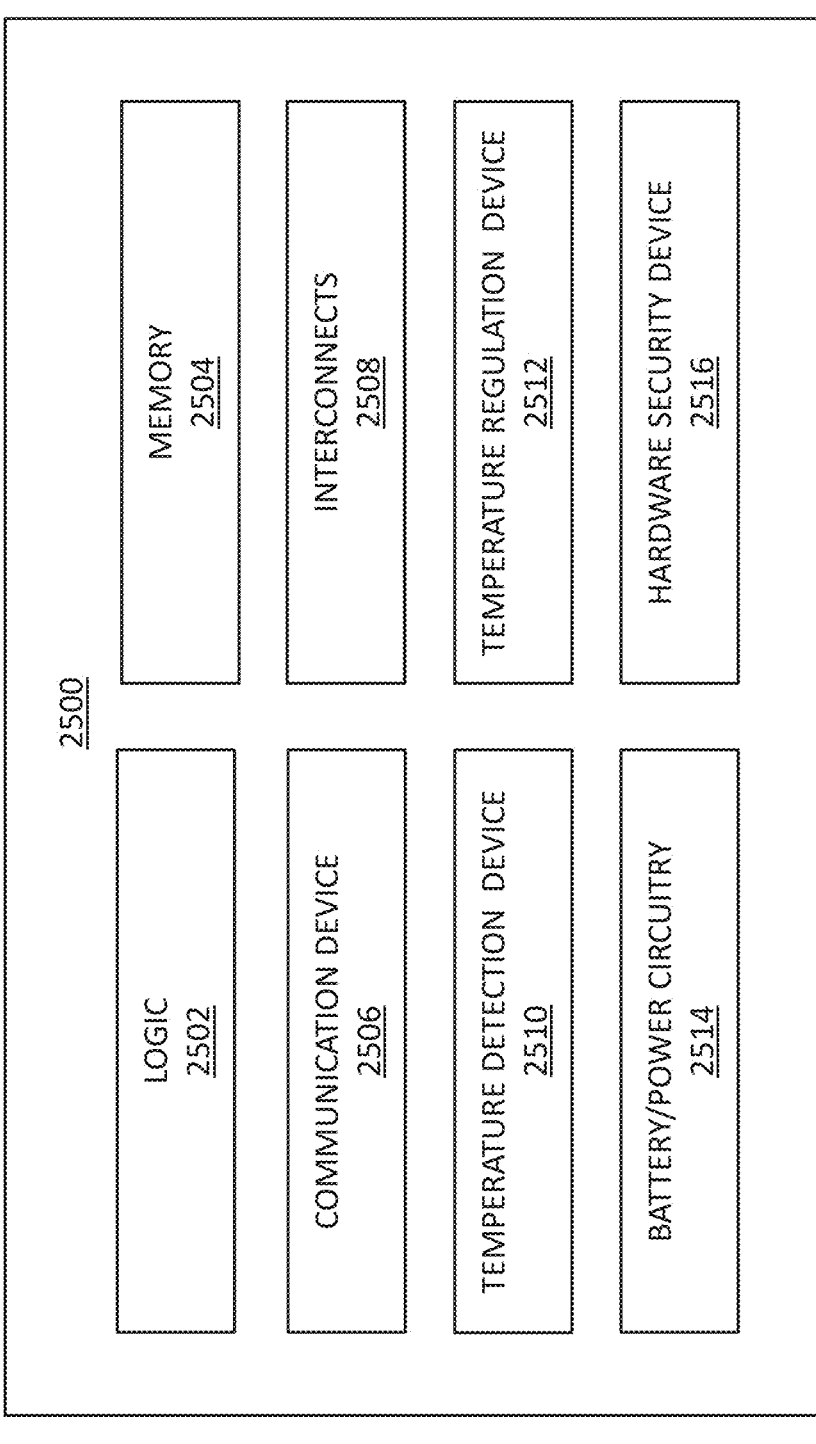
FIG. 15 is a block diagram of an example processing device that may include one or more vertical transistors, according to some embodiments of the disclosure.

FIG. 15 is a block diagram of an example processing device 2500 that may include one or more vertical transistors in accordance with any of the embodiments disclosed herein. For example, any suitable ones of the components of the processing device 2500 may include a die (e.g., the die 2002 (FIG. 11B)) having one or more vertical transistors. Any one or more of the components of the processing device 2500 may include, or be included in, an IC device 2200 (FIG. 12). Any one or more of the components of the processing device 2500 may include, or be included in, an IC device assembly 2300 (FIG. 13). Any one or more of the components of the processing device 2500 may include, or be included in, a computing device 2400 (FIG. 14); for example, the processing device 2500 may be the processing device 2402 of the computing device 2400.

A number of components are illustrated in FIG. 15 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 15, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configure to implement memory circuitry (e.g., ICs implementing one or more of memory devices, memory arrays, control logic configured to control the memory devices and arrays, etc.). In some embodiments, the memory 2504 may be implemented substantially as described above with reference to the memory 2404 (FIG. 14). In some embodiments, the memory 2504 may be a designated device configured to provide storage functionality for the components of the processing device 2500 (i.e., local), while the memory 2404 may be configured to provide system-level storage functionality for the entire computing device 2400 (i.e., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layer or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, i.e., the size and capabilities of each component. With hierarchical memory, each of the various memory components can be viewed as part of a hierarchy of memories $(m_1, m_2, \ldots, m_n)$ in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 2406 (FIG. 14). In some embodiments, the communication device 2506 may be a designated device configured to provide communication functionality for the components of the processing device 2500 (i.e., local), while the communication chip 2406 may be configured to provide system-level communication functionality for the entire computing device 2400 (i.e., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 2500 may include a temperature detection device 2510 which may be implemented substantially as described above with reference to the temperature detection device 2426 (FIG. 14) but configured to determine temperatures on a more local scale, i.e., of the processing device 2500 of components thereof. In some embodiments, the temperature detection device 2510 may be a designated device configured to provide temperature detection functionality for the components of the processing device 2500 (i.e., local), while the temperature detection device 2426 may be configured to provide system-level temperature detection functionality for the entire computing device 2400 (i.e., global).

The processing device 2500 may include a temperature regulation device 2512 which may be implemented substantially as described above with reference to the temperature regulation device 2428 (FIG. 14) but configured to regulate temperatures on a more local scale, i.e., of the processing device 2500 of components thereof. In some embodiments, the temperature regulation device 2512 may be a designated device configured to provide temperature regulation functionality for the components of the processing device 2500 (i.e., local), while the temperature regulation device 2428 may be configured to provide system-level temperature regulation functionality for the entire computing device 2400 (i.e., global).

The processing device 2500 may include a battery/power circuitry 2514 which may be implemented substantially as described above with reference to the battery/power circuitry 2410 (FIG. 14). In some embodiments, the battery/power circuitry 2514 may be a designated device configured to provide battery/power functionality for the components of the processing device 2500 (i.e., local), while the battery/power circuitry 2410 may be configured to provide system-level battery/power functionality for the entire computing device 2400 (i.e., global).

The processing device 2500 may include a hardware security device 2516 which may be implemented substantially as described above with reference to the security interface device 2424 (FIG. 14). In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessors chips.

SELECT EXAMPLES

Example 1 provides an IC device, including: a substrate, the substrate having a first surface and a second surface, the second surface opposite the first surface; a first region as one of a source region and a drain region of a transistor, the first region including a first semiconductor material with first dopants and extending from the first surface towards the second surface (thus, the first region is at least partially, or fully, in the substrate), where a width of the first region at a first distance from the first surface is larger than the width of the first region at a second distance from the first surface, and the second distance is longer than the first distance (i.e., the width of the first region decreases in a direction from the first surface to the second surface, the width being a dimension measured along a direction that is parallel to the substrate and perpendicular to the shortest line connecting the first and second surfaces); a second region as another one of the source region and the drain region, the second region including a second semiconductor material with second dopants; a channel region between the first region and the second region; and a control line of a memory device, the control line including an electrically conductive material, where a portion of the control line wraps around a portion of the channel region.

Example 2 provides the IC device according to example 1, where a ratio of a height of the first region to the width of the first region at the surface is in a range from 0.5 to 10, where the height is a dimension measured in a direction perpendicular to the substrate.

Example 3 provides the IC device according to example 1 or 2, where a concentration of the first dopants in the first region is at least 106 times higher than a concentration of dopants in the channel region.

Example 4 provides the IC device according to any of the preceding claims, where a portion of the first region has a V-shaped cross-section, the cross-section is in a plane that is orthogonal to the first surface.

Example 5 provides the IC device according to any of the preceding claims, further including an insulator between the channel region and the portion of the control line.

Example 6 provides the IC device according to any of the preceding claims, where the first region is a portion of another control line of the memory device.

Example 7 provides the IC device according to any of the preceding claims, further including a memory element of the memory device, where the memory element is coupled to the second region.

Example 8 provides an IC device, including: a substrate; a first control line of a memory device, the first control line including a semiconductor material with dopants, where the first control line is in the substrate and a concentration of the dopants in the first control line is at least $1 \cdot 10^{21}$ cm-3; a transistor arrangement, including: a first region, the first region being a portion of the first control line, a channel region over the substrate, and a second region over the channel region, where the first region is one of a source region and a drain region of the transistor arrangement, the second region is another one of the source region and the drain region, and the channel region is between the first region and the channel region (i.e., both the channel region and the second region are over the substrate, while the first region is in the substrate); a memory element, coupled to the second region; and a second control line, having a portion that at least partially wraps around the channel region.

Example 9 provides the IC device according to example 8, further including an additional transistor arrangement, the additional transistor arrangement includes an additional channel region, and a portion of the additional channel region is wrapped around by the second control line.

Example 10 provides the IC device according to example 9, where the additional transistor arrangement further includes an additional source region and an additional drain region, and another portion of the first control line is one of the additional source region and the additional drain region.

Example 11 provides the IC device according to example 10, further including: another memory element that is coupled to another one of the additional source region and the additional drain region.

Example 12 provides a method for forming an IC structure, including: providing a trench in a substrate, a portion of a cross-section of the trench having a V shape; providing a first region in the trench with a first semiconductor material and first dopants; providing a channel region over the first region with a second semiconductor material; providing a second region over the channel region with a third semiconductor material and second dopants; providing an insulator, the insulator wrapping around at least a portion of the channel region; and providing an electrode, the electrode wrapping around at least a portion of the insulator, where the first region is one of a source region and a drain region of a transistor, and the second region is another one of the source region and drain region.

Example 13 provides the method according to example 12, where the electrode constitutes a first control line of a memory device, the first region constitutes a portion of a second control line of the memory device, and the method further includes: coupling a memory element of the memory device with the second region.

Example 14 provides the method according to example 13, where the memory element is a capacitor, a ferroelectric memory element, a magnetic storage element, a resistor, or another transistor.

Example 15 provides the method according to any one of examples 12-14, where a ratio of a first dimension of the trench along a first direction to a second dimension of the trench along a second direction is in a range from 0.5 to 10, and the first direction is orthogonal to the second direction.

Example 16 provides the method according to any one of examples 12-15, where providing the first region in the trench with the first semiconductor material and the first dopants includes: providing a mixture of a precursor of the first semiconductor material and the first dopants into the trench.

Example 17 provides the method according to any one of examples 12-16, where providing the channel region over the first region with the second semiconductor material includes: providing a precursor of the second semiconductor material into an opening formed by the insulator, where the opening is on a surface of the first region.

Example 18 provides the method according to any one of examples 12-17, where the first semiconductor material is the same as the second semiconductor material or the third semiconductor material.

Example 19 provides the method according to any one of examples 12-18, where providing the second region over the channel region includes: forming the second region on a substrate; and transferring the second region from the substrate to the channel region.

Example 20 provides the method according to any one of examples 12-19, where providing the second region over the channel region includes providing a mixture of a precursor of the third semiconductor material and the second dopants onto a surface of the channel region.

Example 21 provides an IC package, including the IC device according to any one of examples 1-11; and a further IC component, coupled to the IC device.

Example 22 provides the IC package according to example 21, where the further IC component includes one of a package substrate, an interposer, or a further IC die.

Example 23 provides the IC package according to example 21 or 22, where the IC device according to any one of examples 1-11 may include, or be a part of, at least one of a memory device, a computing device, a wearable device, a handheld electronic device, and a wireless communications device.

Example 24 provides an electronic device, including a carrier substrate; and one or more of the IC devices according to any one of examples 1-11 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

Example 34 provides the method according to any one of examples 12-20, further including methods for forming the IC device according to any one of examples 1-11.

Example 35 provides the method according to any one of examples 12-20, further including methods for forming the IC package according to any one of examples 21-23.

Example 36 provides the method according to any one of examples 12-20, further including processes for forming the electronic device according to any one of examples 24-33.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:

a substrate, the substrate having a first surface and a second surface, the second surface opposite the first surface;

a first region as one of a source region and a drain region of a transistor, the first region comprising a first semiconductor material with first dopants and extending from the first surface towards the second surface, wherein a width of the first region at a first distance from the first surface is larger than the width of the first region at a second distance from the first surface, and the second distance is shorter than the first distance;

a second region as another one of the source region and the drain region, the second region comprising a second semiconductor material with second dopants;

a channel region between the first region and the second region; and a control line of a memory device, the control line comprising an electrically conductive material, wherein a portion of the control line wraps around a portion of the channel region, wherein a concentration of the first dopants in the first region is at least $10^6$ times higher than a concentration of dopants in the channel region.

2. The IC device according to claim 1, wherein a ratio of a height of the first region to the width of the first region at the surface is in a range from 0.5 to 10.

3. The IC device according to claim 1, wherein a portion of the first region has a V-shaped cross-section, and the cross-section is in a plane that is orthogonal to the first surface.

4. The IC device according to claim 1, further comprising an insulator between the portion of the channel region and the portion of the control line.

5. The IC device according to claim 1, wherein the first region is a portion of another control line of the memory device.

6. The IC device according to claim 1, further comprising a memory element of the memory device, wherein the memory element is coupled to the second region.

7. An integrated circuit (IC) device, comprising:

a substrate;

a first control line of a memory device, the first control line comprising a semiconductor material with dopants, wherein the first control line is in the substrate;

a transistor arrangement, comprising:

a first region, the first region being a portion of the first control line, a channel region over the substrate, and a second region over the channel region, wherein the first region is one of a source region and a drain region of the transistor arrangement, the second region is another one of the source region and the drain region, the channel region is between the first region and the channel region, and a concentration of the dopants in the first region is at least $10^6$ times higher than a concentration of dopants in the channel region;

a memory element, coupled to the second region; and a second control line, having a portion that at least partially wraps around the channel region.

8. The IC device according to claim 7, further comprising an additional transistor arrangement, the additional transistor arrangement includes an additional channel region, and a portion of the additional channel region is wrapped around by another portion of the second control line.

9. The IC device according to claim 8, wherein the additional transistor arrangement further includes an additional source region and an additional drain region, and another portion of the first control line is one of the additional source region and the additional drain region.

10. The IC device according to claim 9, further comprising:

another memory element that is coupled to another one of the additional source region and the additional drain region.

* * * * *